United States Patent
Ishimaru et al.

(10) Patent No.: US 10,205,314 B2
(45) Date of Patent: Feb. 12, 2019

(54) RECTIFIER INCLUDING MOSFET AND HOLD CIRCUIT THAT BOOSTS GATE VOLTAGE OF MOSFET, AND ALTERNATOR USING THE SAME

(71) Applicant: Hitachi Power Semiconductor Device, Ltd., Hitachi-shi, Ibaraki (JP)

(72) Inventors: Tetsuya Ishimaru, Tokyo (JP); Mutsuhiro Mori, Tokyo (JP); Shinichi Kurita, Hitachi (JP)

(73) Assignee: Hitachi Power Semiconductor Device, Ltd., Hitachi-shi (JP)

( * ) Notice: Subject to any disclaimer, the term of this patent is extended or adjusted under 35 U.S.C. 154(b) by 0 days.

(21) Appl. No.: 15/819,315

(22) Filed: Nov. 21, 2017

(65) Prior Publication Data

US 2018/0191152 A1    Jul. 5, 2018

(30) Foreign Application Priority Data

Nov. 28, 2016 (JP) ................. 2016-229656

(51) Int. Cl.
*H02H 7/06* (2006.01)
*H02M 3/335* (2006.01)
(Continued)

(52) U.S. Cl.
CPC ............. *H02H 7/067* (2013.01); *H02J 7/14* (2013.01); *H02K 11/046* (2013.01); *H02M 1/08* (2013.01);
(Continued)

(58) Field of Classification Search
CPC ...... H02K 11/046; H02M 1/08; H02M 1/081; H02M 1/4205; H02M 1/4225;
(Continued)

(56) References Cited

U.S. PATENT DOCUMENTS

| 8,416,548 B2 | 4/2013 | Doffin |
| 8,427,801 B2 | 4/2013 | Goerlach et al. |

(Continued)

FOREIGN PATENT DOCUMENTS

| DE | 10 2009 046 955 A1 | 5/2011 |
| DE | 10 2015 012 585 A1 | 4/2016 |

(Continued)

OTHER PUBLICATIONS

Extended European Search Report issued in counterpart European Application No. 17001694.3 dated Feb. 27, 2018 (seven (7) pages).

*Primary Examiner* — Yemane Mehari
(74) *Attorney, Agent, or Firm* — Crowell & Moring LLP

(57) ABSTRACT

A rectifier includes a rectification MOSFET that performs rectification, a comparator formed by connecting a drain of the rectification MOSFET to a non-inverting input terminal and a source to an inverting input terminal, and a control circuit that performs an on/off control of the rectification MOSFET using an output of the comparator. The control circuit includes a shut-off MOSFET that disconnects a drain of the rectification MOSFET and a non-inverting input terminal of the comparator from each other, and a shut-off circuit that turns off the shut-off MOSFET to electrically disconnect the drain of the rectification MOSFET and the non-inverting input terminal of the comparator from each other when the drain voltage of the rectification MOSFET is equal to or higher than a predetermined first voltage.

20 Claims, 20 Drawing Sheets

(51) Int. Cl.
  *H02M 7/219*   (2006.01)
  *H02J 7/14*    (2006.01)
  *H02K 11/04*   (2016.01)
  *H02M 1/08*    (2006.01)
  *H02M 7/217*   (2006.01)

(52) U.S. Cl.
  CPC ....... *H02M 3/33592* (2013.01); *H02M 7/217* (2013.01); *H02M 7/219* (2013.01); *H02M 2007/2195* (2013.01)

(58) Field of Classification Search
  CPC .. H02M 7/217; H02M 7/1555; H02M 7/1557; H02M 7/067; H02M 7/219; H02M 3/33592; Y02B 70/126; H02J 7/14
  USPC ...................................... 363/84–89
  See application file for complete search history.

(56) References Cited

U.S. PATENT DOCUMENTS

| | | |
|---|---|---|
| 2003/0095365 A1 | 5/2003 | Nakatake et al. |
| 2012/0281446 A1 | 11/2012 | Magini et al. |
| 2015/0295494 A1* | 10/2015 | Gong ................ H05B 33/0815 315/224 |
| 2016/0099658 A1 | 4/2016 | Ishimaru et al. |
| 2016/0315553 A1* | 10/2016 | Ishimaru .............. H03K 17/163 |
| 2017/0110959 A1* | 4/2017 | Ishimaru .............. H03K 17/302 |

FOREIGN PATENT DOCUMENTS

| | | |
|---|---|---|
| JP | 2009-524403 A | 6/2009 |
| JP | 2011-507468 A | 3/2011 |

\* cited by examiner

RECTIFIER INCLUDING MOSFET AND HOLD CIRCUIT THAT BOOSTS GATE VOLTAGE OF MOSFET, AND ALTERNATOR USING THE SAME

BACKGROUND OF THE INVENTION

1. Field of the Invention

The present invention relates to an autonomous type synchronous rectification metal oxide semiconductor field effect transistor (MOSFET) rectifier and an alternator using the same.

2. Description of the Related Art

A diode has been employed as a rectification element in an alternator that generates electricity in a vehicle until now. The diode is inexpensive, but has a large loss due to a forward voltage drop. In this regard, in recent years, a metal oxide semiconductor field effect transistor (MOSFET) has been employed in place of the diode as a rectification element of the alternator. Since the MOSFET performs synchronous rectification, a forward voltage drop does not occur, and a forward current is generated just above 0 V. Therefore, it is possible to implement a rectification element having a little loss.

As a method for performing an on/off control of the synchronous rectification MOSFET of the alternator, there is known a method of controlling the MOSFET by detecting a position of the motor using a Hall element. Such a control method performed by receiving an external signal from the Hall element or the like is called an external control type here. In the external control type synchronous rectification MOSFET, it is necessary to use a sensor such as the Hall element and perform a complicated control using a control circuit. Therefore, a rectification unit of the alternator becomes expensive.

As another method of performing the on/off control of the synchronous rectification MOSFET of the alternator, JP-2011-507468-A discusses a method of performing a MOSFET control by determining a voltage between a source and a drain of the synchronous rectification MOSFET. A method of performing the control on the basis of an internal voltage without such an external signal will be referred to as an autonomous type. The autonomous type synchronous rectification MOSFET does not necessitate a sensor such as the Hall element and typically has a simple control circuit. Therefore, it is possible to reduce the cost of the rectification unit of the alternator. In addition, since a capacitor is integrated as a power source, the number of external terminals can be reduced to two. As a result, it is possible to obtain the same terminal configuration as that of the diode and substitute a circuit configuration of the alternator with the diode of the alternator without a change.

In the alternator, when a load dump phenomenon in which an output terminal or a battery terminal of the alternator is removed during electric generation operation occurs, it is necessary to internally consume the energy generated by the electric generation to prevent a high voltage from being output to the output terminal of the alternator. In a case where a diode is employed as the rectification element of the related art, the energy during the load dump is consumed in the diode by allowing the diode has a clamp function as a Zener diode.

In comparison, a method of consuming energy during a load dump in a case where a synchronous rectification MOSFET is employed in place of the diode is discussed in JP-2009-524403-A. In the method discussed in JP-2009-524403-A, the current is attenuated by circulating it in a bridge circuit and a generator by electrically conducting a LOW-side MOSFET or a HIGH-side MOSFET during the load dump, so as to consume the energy during the load dump. In a case where the LOW-side MOSFET is electrically conducted, and a voltage of the stator coil during the load dump increases, a controller detects a voltage higher than that, so that the LOW-side MOSFET is turned on, and the HIGH-side MOSFET is turned off. By controlling the LOW-side MOSFET and the HIGH-side MOSFET in combination, it is possible to prevent a current from flowing through the HIGH-side MOSFET and the LOW-side MOSFET. In addition, when the voltage of the stator coil becomes equal to or lower than a voltage necessary to supply electricity to an electric load in order to continuously feed electricity to the electric load connected to the alternator during the load dump, inversely, the LOW-side MOSFET is turned off, and the HIGH-side MOSFET is turned on in some cases. In this case, an operation of turning off the LOW-side MOSFET and turning on the HIGH-side MOSFET and an operation of turning on the LOW-side MOSFET is turned on and turning off the HIGH-side MOSFET are repeated, so that the voltage of the stator coil is maintained in the necessary voltage or higher.

SUMMARY OF THE INVENTION

In the autonomous type synchronous rectification MOSFET having a pair of external terminals, it is difficult to perform the on/off control of the MOSFET using an external controller or an external signal. Therefore, it is difficult to detect an abnormal voltage during a load dump and control the LOW-side MOSFET and the HIGH-side MOSFET in combination on the basis of the detection. As a result, it is not easy to prevent the current from flowing through the HIGH-side MOSFET and the LOW-side MOSFET. In particular, it is not easy to prevent the through current when an operation of turning off the LOW-side MOSFET and turning on the HIGH-side MOSFET and an operation of turning on the LOW-side MOSFET and turning off the HIGH-side MOSFET are repeated in order to continuously feed electricity to an electric load connected to the alternator during a load dump. In addition, when the operation of turning off the LOW-side MOSFET and turning on the HIGH-side MOSFET and the operation of turning on the LOW-side MOSFET and turning off the HIGH-side MOSFET are repeated, electric charges of the capacitor used as a power source of the control circuit in the autonomous type synchronous rectification MOSFET having a pair of external terminals are continuously consumed by repeating driving of the gate of the MOSFET. Therefore, it is difficult to sufficiently drive the gate of the MOSFET due to deficiency of electric charges in the capacitor. As a result, it may be difficult to turn on the MOSFET.

In this regard, an object of the present invention is to provide a rectifier of an autonomous type synchronous rectification MOSFET capable of consuming energy by circulating and attenuating a current during a load dump in a bridge circuit and a generator, and in particular, a rectifier of an autonomous type synchronous rectification MOSFET having a pair of external terminals, and an alternator using the same.

In order to address the aforementioned problems, according to an aspect of the present invention, there is provided a rectifier including: a metal oxide semiconductor field effect transistor (MOSFET) configured to perform rectification; a control circuit configured to receive a voltage between a pair of main terminals of the MOSFET and perform an on/off operation of the MOSFET on the basis of the voltage between the pair of main terminals; a power source configured to supply a source voltage to the control circuit; and a hold circuit configured to boost a gate voltage of the MOSFET when an internal trigger voltage of the control circuit is equal to or higher than a first voltage and hold the boosted state for a period independent from a voltage between the pair of main terminals.

According to another aspect of the present invention, there is provided an alternator provided with a rectification circuit, including the rectifier described above as a first rectifier, the first rectifier being provided in any one of LOW and HIGH sides of the rectification circuit.

According to the present invention, it is possible to provide a rectifier of an autonomous type synchronous rectification MOSFET, in particular, a rectifier of an autonomous type synchronous rectification MOSFET having two external terminal, and an alternator having the same, capable of consuming energy generated during a load dump by turning on the rectification MOSFET and holding the ON state.

DESCRIPTION OF THE PREFERRED EMBODIMENTS

Figure 1:
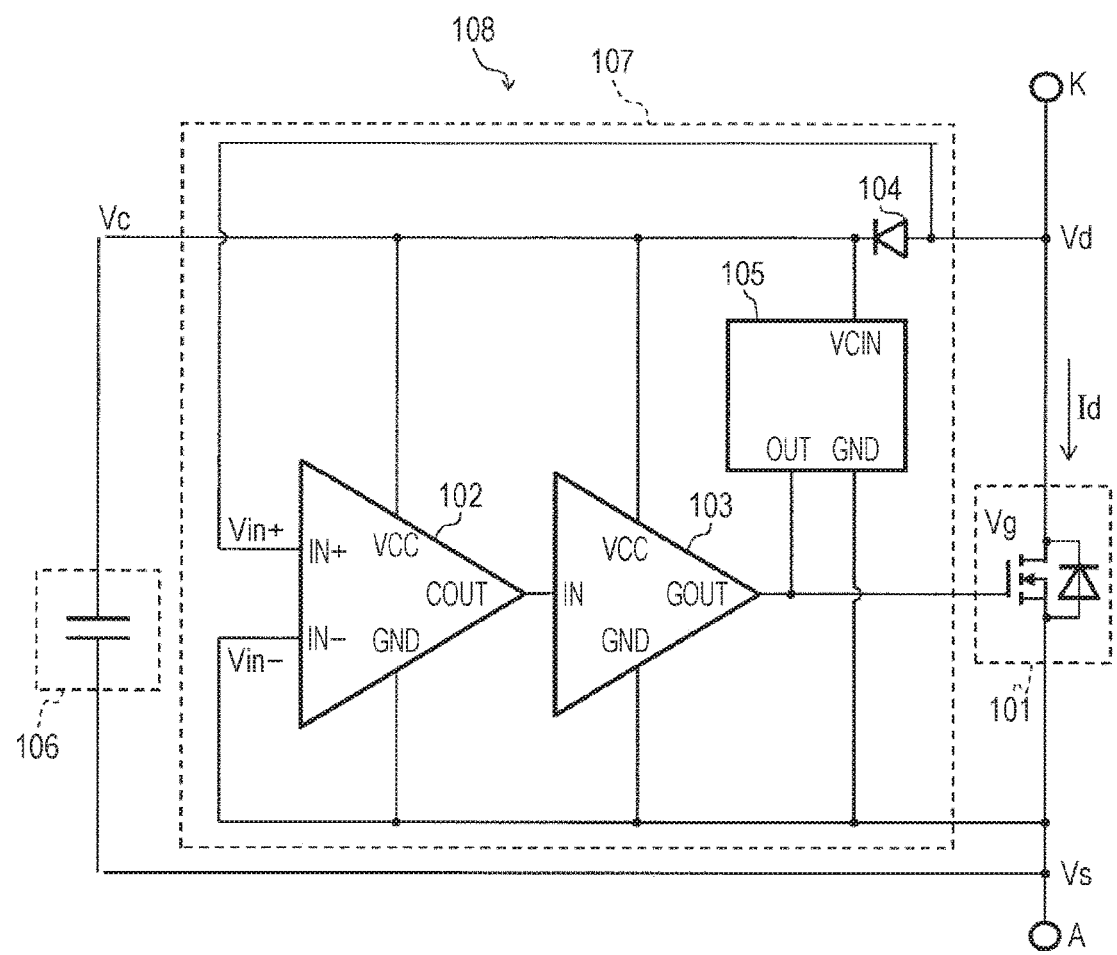
FIG. 1 is a circuit diagram illustrating a rectifier of an autonomous type synchronous rectification MOSFET according to a first embodiment.

Hereinafter, modes for carrying out the present invention will be described in details with reference to the respective drawings. In the drawings for describing the embodiments, like reference numerals denote like elements, and they will not be described repeatedly as appropriate. In addition, in the following description of the embodiment, identical or similar parts will not be described repeatedly as appropriate unless particularly necessary.

FIG. 1 is a circuit diagram illustrating a rectifier 108 of an autonomous type synchronous rectification MOSFET having a pair of external terminals according to a first embodiment.

As illustrated in FIG. 1, the rectifier 108 of the autonomous type synchronous rectification MOSFET according to the first embodiment has a pair of external terminals including a positive electrode main terminal K and a negative electrode main terminal A, a rectification MOSFET 101, a capacitor 106, and a control circuit 107. The control circuit 107 has, for example, a comparator 102, a gate drive circuit 103, a diode 104, and an overvoltage detection and gate drive hold circuit 105. However, the gate drive circuit 103 is not an indispensable element in the present invention as described below.

The rectification MOSFET 101 internally has a parasitic diode to perform rectification. The control circuit 107 includes the comparator 102, whose non-inverting input terminal IN+(first input terminal) is connected to a drain of the rectification MOSFET 101 via a shut-off MOSFET 105 and whose inverting input terminal IN− (second input terminal) is connected to a source of the rectification MOSFET 101. For example, in a case where the control circuit 107 has a gate drive circuit 103, the gate drive circuit 103 that receives an output of the comparator 102 is configured to perform an on/off control of the rectification MOSFET 101.

Typically, as the rectification MOSFET 101, a power MOSFET is employed because a large current generated by a generator unit of the alternator flows. The rectification MOSFET 101 performs synchronous rectification to flow the rectification current. The rectification MOSFET 101 has a drain connected to the positive electrode main terminal K and a source connected to the negative electrode main terminal A. Therefore, the internal diode of the rectification MOSFET 101 has an anode connected to the negative electrode main terminal A and a cathode connected to the positive electrode main terminal K.

In the rectification MOSFET 101, a drain voltage Vd is applied to the drain, a source voltage Vs is applied to the source, and a gate voltage Vg is applied to the gate. In addition, in the rectifier 108, the source voltage Vs of the rectification MOSFET 101 corresponds to the GND voltage.

In the comparator 102, the non-inverting input terminal IN+ is connected to the drain of the rectification MOSFET 101, and the inverting input terminal IN− is directly connected to the source of the rectification MOSFET 101. An output terminal COUT of the comparator 102 is connected to an input terminal IN of the gate drive circuit 103. An output signal of the comparator 102 is output from the output terminal COUT of the comparator 102. The comparator 102 compares voltages between the non-inverting input terminal IN+ and the inverting input terminal IN− and changes over the output signal depending on a result of the voltage difference. The comparator 102 outputs a result of the comparison between the source voltage Vs of the negative electrode main terminal A and the drain voltage Vd of the positive electrode main terminal K. The comparator 102 preferably has high accuracy, but the present invention is not limited thereto. In addition, the comparator 102 is not necessarily a so-called comparator as long as it can switch the output depending on a voltage difference between the drain and the source of the rectification MOSFET 101. For example, a circuit such as a differential amplifier may also be employed in place of the comparator.

In a case where the control circuit 107 has the gate drive circuit 103, the gate drive circuit 103 is provided in a rear stage of the comparator 102, and its output terminal GOUT is connected to the gate of the rectification MOSFET 101. The on/off driving operation of the gate of the rectification MOSFET 101 is performed on the basis of a magnitude of the voltage input to the input terminal IN. In this case, it is possible to drive the gate of the rectification MOSFET 101 faster by providing the gate drive circuit 103.

Meanwhile, in a case where the control circuit 107 does not have the gate drive circuit 103, the output terminal of the comparator 102 or the differential amplifier (the output terminal COUT in the case of the comparator 102) is connected to the gate of the rectification MOSFET 101. As described above, the gate drive circuit 103 is not dispensable, and the on/off driving operation of the gate of the rectification MOSFET 101 may be performed using the output of the comparator 102 or the like. In this case, since the gate drive circuit 103 is omitted, it is possible to simplify a circuit configuration of the control circuit 107. If a necessary gate driving speed can be obtained without the gate drive circuit 103, it is possible to further reduce the manufacturing cost while securing performance of the rectifier.

The diode 104 is connected between the positive electrode main terminal K and the positive terminal of the capacitor 106 such that a forward bias direction matches a direction of the diode 104 from the positive electrode main terminal K to the positive terminal of the capacitor 106. Electric charges that form the current flowing through the diode 104 are accumulated in the capacitor 106 and serve as a power source for driving the control circuit 107.

In the overvoltage detection and gate drive hold circuit 105, a capacitor voltage input terminal VCIN is connected to the positive terminal of the capacitor 106, a ground terminal GND is connected to the source of the rectification MOSFET 101, and an output terminal OUT is connected to the gate of the rectification MOSFET 101.

The overvoltage detection and gate drive hold circuit 105 detects an overvoltage applied to the drain voltage Vd of the rectification MOSFET 101 during a load dump and boosts the gate of the rectification MOSFET 101 to turn on the rectification MOSFET 101. Then, this state is held for a predetermined time (for example, a certain time).

The control circuit 107 may be configured of, for example, a one-chip integrated circuit (IC) having a single silicon integrated circuit chip. In this case, it is anticipated to obtain at least one of merits such as low cost, small area, and high anti-noise performance.

The capacitor 106 supplies power source for operating the control circuit 107. Hereinafter, a voltage of the positive terminal of the capacitor 106 will be referred to as a capacitor voltage Vc. Since the capacitor 106 is used as a power source of the control circuit 107, the number of external terminals of the rectifier 108 becomes two. As a result, it is possible to provide the rectifier 108 with compatibility with a conventional rectification diode that has been used in the alternator 140 in terms of the number of the external terminals. As a result, it is possible to improve performance of the alternator 140 by substituting the conventional rectification diode with the rectifier 108. Note that an external power source may also be used in place of the capacitor 106.

An exemplary circuit configuration of the overvoltage detection and gate drive hold circuit 105 of the rectifier 108 according to the first embodiment and operations thereof will now be described with reference FIGS. 2 and 3.

Figure 2:
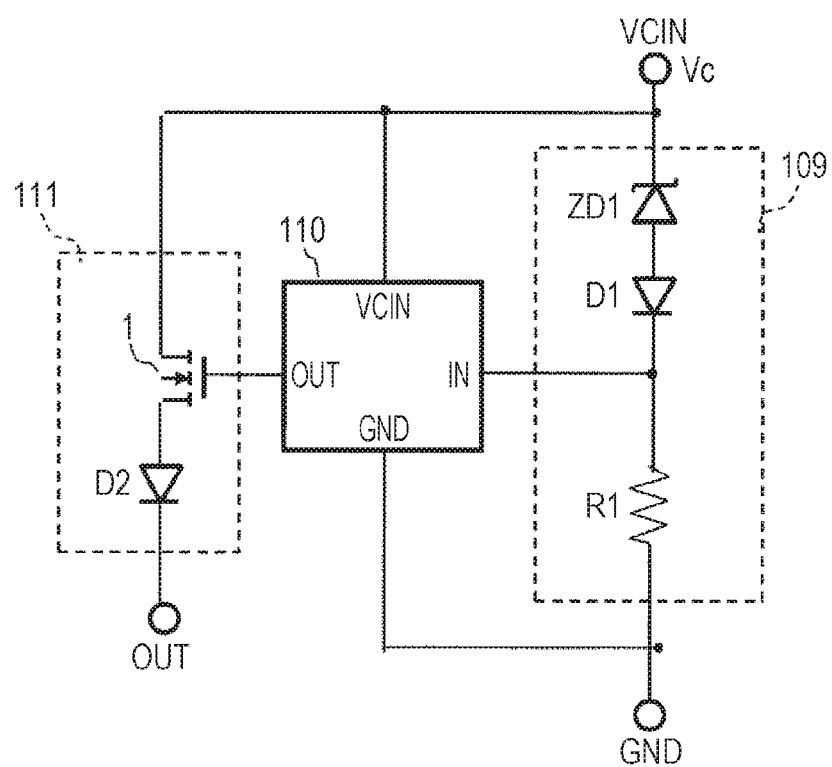
FIG. 2 is a circuit diagram illustrating an overvoltage detection and gate drive circuit provided in the rectifier according to the first embodiment.

FIG. 2 is an exemplary circuit diagram illustrating the overvoltage detection and gate drive hold circuit 105 provided in the rectifier 108 according to the first embodiment.

The overvoltage detection and gate drive hold circuit 105 has an overvoltage detection circuit 109, a hold circuit 110, and an overvoltage gate drive circuit 111.

The overvoltage detection circuit 109 includes a Zener diode ZD, a diode D1, and a resistor R1 connected in series between the VCIN terminal of the overvoltage detection and gate drive hold circuit 105 and the GND terminal.

The hold circuit 110 has a VCIN terminal connected to the VCIN terminal of the overvoltage detection and gate drive hold circuit 105 and a GND terminal connected to the GND terminal of the overvoltage detection and gate drive hold circuit 105. The terminal IN is connected between the diode D1 and the resistor R1 corresponding to an output portion of the overvoltage detection circuit 109. The terminal IN may also be connected between the Zener diode ZD and the diode D1. The output terminal is connected to a gate of the n-type MOSFET (NMOS) 1 of the overvoltage gate drive circuit 111.

The overvoltage gate drive circuit 111 includes an NMOS 1 and a diode D2 connected in series between the VCIN terminal and the GND terminal. The positions of the NMOS 1 and the diode D2 may be reversed. The NMOS 1 may also be a p-type MOSFET (PMOS) in FIG. 2.

Figure 3:
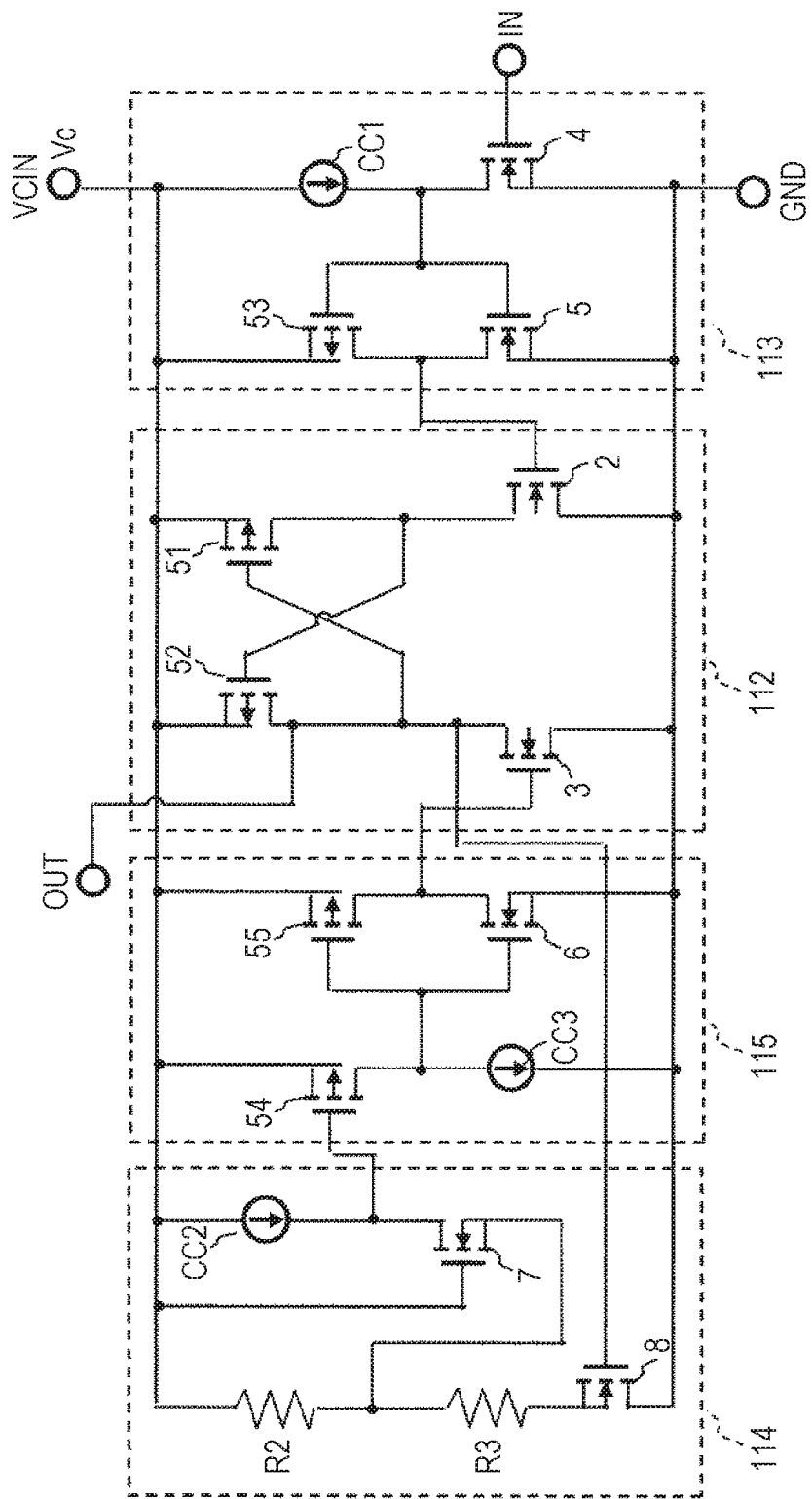
FIG. 3 is a circuit diagram illustrating a hold circuit provided in the overvoltage detection and gate drive circuit according to the first embodiment.

FIG. 3 is an exemplary circuit diagram illustrating the hold circuit 110 of the rectifier 108 according to the first embodiment.

The hold circuit 110 has a latch circuit 112 that holds an output, an input signal boosting circuit 113 that sufficiently boosts an input signal, an output-stop decision circuit 114 that stops the output after a certain time, and an output-stop and signal boosting circuit 115 that sufficiently boosts an output stop signal.

The latch circuit 112 has a typical latch circuit configuration provided with a MOS pair including a PMOS 51 and an NMOS 2 and a MOS pair including a PMOS 52 and an NMOS 3. A node between the PMOS 52 and the NMOS 3 serves as an output of the latch circuit and is connected to the gate of the NMOS 1 of the overvoltage gate drive circuit 111. In a case where a PMOS is used instead of the NMOS 1 of the overvoltage gate drive circuit 111, the wire between the PMOS 51 and the NMOS 2 serves as an output of the latch circuit.

The input signal boosting circuit 113 has two stages of inverters including a constant current circuit CC1, an NMOS 4, a PMOS 53, and an NMOS 5. An output of the overvoltage detection circuit 109 is connected to an input of the front stage inverter, and an output of the rear stage inverter is connected to a gate of the NMOS 2 of the latch circuit.

The output-stop decision circuit 114 has two stages of resistors R2 and R3, an NMOS 8, and a constant current circuit CC2 and an NMOS 7 connected in series between the VCIN terminal and an intermediate node of the resistors R2 and R3. A gate of the NMOS 8 is connected to a wire between the PMOS 52 and the NMOS 3 of the latch circuit 112. A gate of the NMOS 7 is connected to the VCIN terminal to determine an output stop under the OFF state of the NMOS 7. The wire between the constant current circuit CC2 and the NMOS 7 serves as the output of the output-stop decision circuit 114.

The output-stop and signal boosting circuit 115 has a PMOS 54, a constant current circuit CC3, and two stages of inverters including a PMOS 55 and an NMOS 6. An output of the rear stage inverter is connected to the gate of the NMOS 2 of the latch circuit. An output of the output-stop decision circuit 114 is connected to an input of the front stage inverter, and an output of the rear stage inverter is connected to the gate of the NMOS 3 of the latch circuit 112.

The constant current circuits CC1, CC2, and CC3 are used to limit the current. For example, an n-type depletion MOSFET having a gate short-circuited to a source is employed. Alternatively, a resistor may also be employed. This similarly applies to other constant current circuits described below.

Although the hold circuit 110 having the latch circuit 112 has been described in conjunction with FIG. 3, a circuit capable of holding a state by feeding back the inverter may be employed in place of the latch circuit 112. Since the latch circuit 112 is not used, it is possible to reduce a possibility that a state is inverted and is held erroneously.

Subsequently, operations of the rectifier 108 according to the first embodiment when an overvoltage is applied during a load dump will be described with reference to FIGS. 1 to 3.

As a voltage between two external terminals, that is, positive electrode main terminal K and the negative electrode main terminal A of the rectifier 108 increases, a forward bias current flows to the diode 104 of the control circuit 107 to charge the capacitor 106, so that the capacitor voltage Vc increases. If the capacitor voltage Vc is applied to a cathode of the Zener diode ZD of the overvoltage detection circuit 109 of the control circuit 107, and the capacitor voltage Vc exceeds a Zener voltage Vz of the Zener diode ZD, a current flows to the Zener diode ZD. The current flowing through the Zener diode ZD flows to the resistor R1 to boost the voltage of the input terminal IN of the hold circuit 110. As a result, in the hold circuit 110, the NMOS 4 is turned on, the PMOS 53 is turned on, and the NMOS 2 is turned on. Subsequently, the latch circuit 112 fixes the PMOS 52 in the ON state and the PMOS 51 in the OFF state. As a result, a high voltage of the capacitor voltage Vc is output to the output terminal OUT of the hold circuit 110. The high voltage of the output terminal OUT of the hold circuit 110 turns on the NMOS 1 of the overvoltage gate drive circuit 111, so that the current flows to the gate of the rectification MOSFET 101 connected to the VCIN terminal of the overvoltage detection and gate drive hold circuit 105 through the NMOS 1 and the diode D2 of the overvoltage gate drive circuit 111, and the gate voltage of the rectification MOSFET 101 is boosted to the capacitor voltage Vc. As a result, the rectification MOSFET 101 is turned on.

The capacitor voltage Vc is charged to a high voltage with the overvoltage between two external terminals, that is, the positive electrode main terminal K and the negative electrode main terminal A. The rectification MOSFET 101 having the gate where the high voltage is applied has a sufficiently low resistance, so that the voltage between the drain and the source of the rectification MOSFET 101 sufficiently decreases. The overvoltage between two external terminals, that is, the positive electrode main terminal K and the negative electrode main terminal A is eliminated, so that the current does not flow to the Zener diode ZD of the overvoltage detection circuit 109. However, the latch circuit 112 holds the high voltage output of the overvoltage detection and gate drive hold circuit 105, and the rectification MOSFET 101 continuously maintains the ON state with a low resistance in the gate where the high voltage is applied.

While the rectification MOSFET 101 continuously maintains the ON state, the capacitor voltage Vc gradually decreases due to the current flowing through the control circuit 107, that is, the current flowing through the comparator 102 and the overvoltage detection and gate drive hold circuit 105. Accordingly, the gate voltage Vg of the rectification MOSFET 101 decreases. As the capacitor voltage Vc decreases, a voltage drop of the resistor R2 of the output-stop decision circuit 114 decreases. As this voltage drop is smaller than a threshold voltage of the PMOS 7 of the output-stop decision circuit 114, the PMOS 7 is turned off. As a result, in the output-stop and signal boosting circuit 115, the PMOS 54 is turned off, the PMOS 55 is turned on, the NMOS 3 of the latch circuit 112 is turned on, and the PMOS 51 is turned on. As a result, the state of the latch circuit is inverted, and the low voltage of the GND terminal is output to the output terminal OUT of the hold circuit 110. In this case, the NMOS 1 of the overvoltage gate drive circuit 111 is turned off, and the voltage of the gate of the rectification MOSFET 101 connected to the output terminal OUT of the overvoltage detection and gate drive hold circuit 105 decreases, so that the rectification MOSFET 101 has an OFF state.

As described above, in the rectifier 108 according to the first embodiment, as the overvoltage between two external terminals is applied, and the capacitor voltage Vc increases, the rectification MOSFET 101 holds the ON state. As the capacitor voltage Vc decreases due to the current of the control circuit 107, the rectification MOSFET 101 holds the OFF state.

Figure 4:
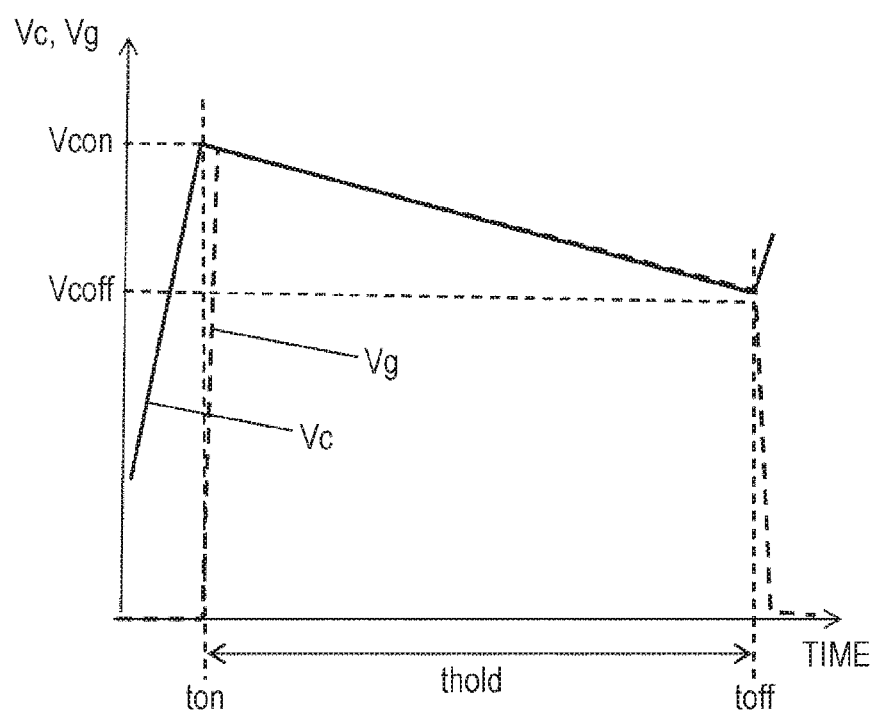
FIG. 4 is a graph for describing operations of the overvoltage detection and gate drive circuit according to the first embodiment.

FIG. 4 is a graph for describing a hold time thold for holding the ON state in the rectification MOSFET 101. In this graph, the abscissa refers to time, and the ordinate refers to the capacitor voltage Vc and the drain voltage Vd.

Here, "Vcon" denotes a capacitor voltage when the rectification MOSFET 101 is turned on, "ton" denotes a timing at that moment, "Vcoff" denotes a capacitor voltage for turning off the rectification MOSFET 101, and "toff" denotes a timing at that moment.

The time thold for holding the ON state in the rectification MOSFET 101, that is, the time from the timing ton to the timing toff is defined as "thold=(Vcon−Vcoff)×C/Iic" where "C" denotes a capacitance of the capacitor 106, and "Iic" denotes a consumed current of the control circuit when the rectification MOSFET 101 holds the ON state.

Out of the parameters for determining the hold time thold, "Vcon" is set to be higher than a maximum voltage of normal operation of the alternator 140, and the output voltage of the alternator 140 during a load dump is set to be smaller than an allowable voltage. "Vcoff" is preferably set to be higher than the capacitor voltage Vc during a normal rectification operation. As a result, during a normal rectification operation, the NMOS 3 of the latch circuit 112 is turned on at all times, so that it is possible to prevent inversion of the latch circuit state. The capacitance "C" is preferably set to a minimum capacitance by which a voltage necessary to drive the control circuit 102 can be supplied during a normal rectification operation. If the capacitance "C" is higher than a necessary level, the capacitor size increases, and this also generates a cost increase. The current "Iic" is a sum of the current flowing through the comparator 102 and the overvoltage detection and gate drive hold circuit 105 while the rectification MOSFET 101 holds the ON state. The current flowing through the overvoltage detection and gate drive hold circuit 105 can be freely designed. Therefore, design may be performed to obtain a desired hold time thold by determining the current Iic using the current of overvoltage detection and gate drive hold circuit 105. Specifically, design is performed to obtain a desired current Iic and a desired hold time thold using the constant current value of the constant current circuit CC2 or CC3 included in the overvoltage detection and gate drive hold circuit 105 or the resistance value of the resistor R2 or R3. In the circuit illustrated in FIGS. 2 and 3, the current Iic flows only when the rectification MOSFET 101 is held in the ON state by virtue of the overvoltage. In a normal rectification operation, all of the current paths of the overvoltage detection and gate drive hold circuit 105 are shut off by the NMOS or the PMOS, so that the current Iic does not flow, and there is no influence on the normal rectification operation. For example, a design value of the hold time thold is set to be longer than the maximum time for entirely consuming energy in the load dump in order to turn off the rectification MOSFET 101 after consuming the whole energy of the load dump.

In the rectifier 108 according to the first embodiment, the ON and OFF states of the rectification MOSFET 101 during application of the overvoltage are determined on the basis of the same capacitor voltage Vc. Therefore, it is possible to facilitate design of the hold time thold without significantly depending on the operational condition (such as a value dv/dt of the overvoltage or the surrounding temperature).

Figure 5:
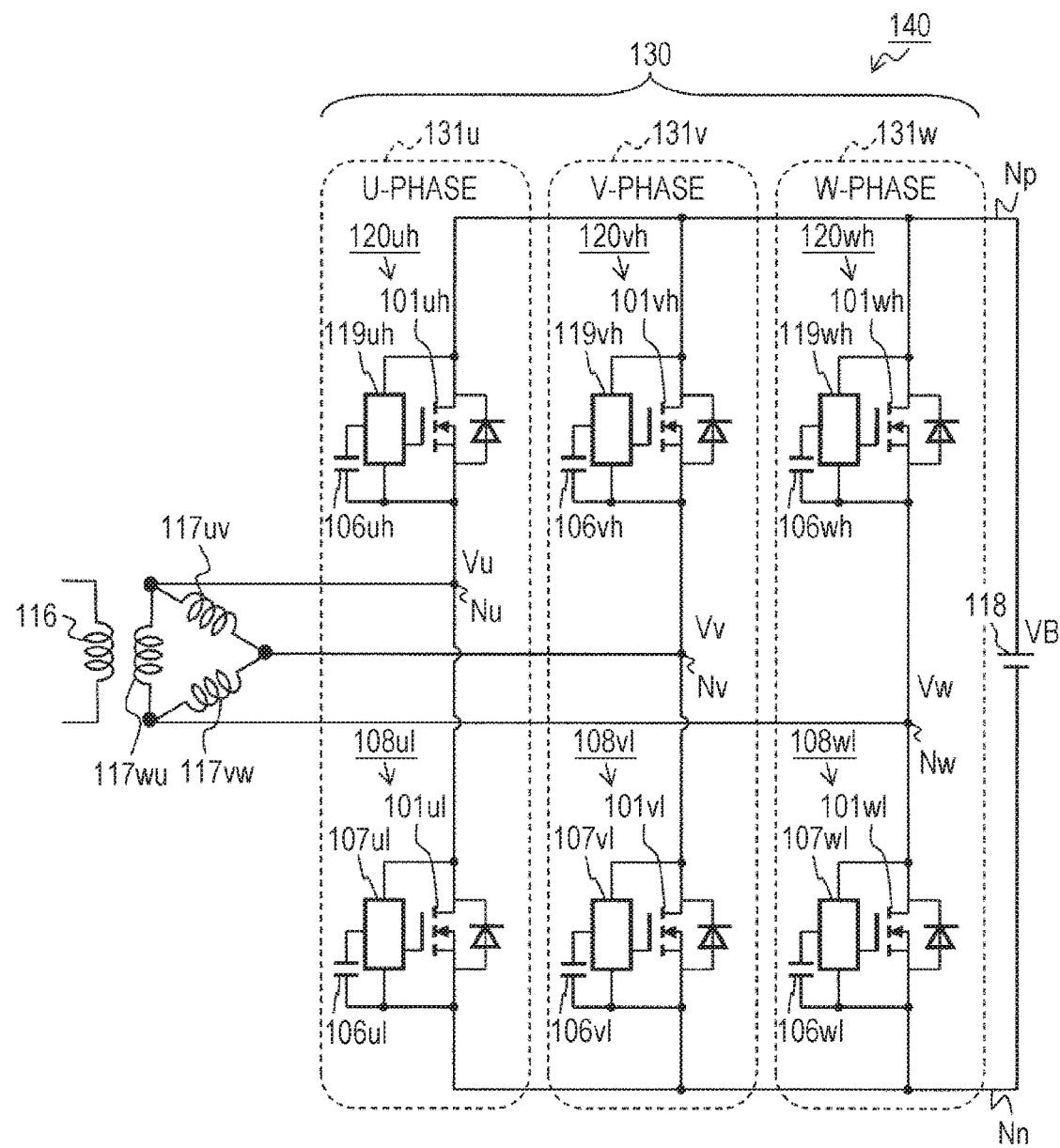
FIG. 5 is a circuit diagram illustrating a schematic configuration of an alternator using the rectifier according to the first embodiment.

FIG. 5 is a circuit diagram illustrating a schematic configuration of an alternator 140 using an autonomous type rectifier 108.

As illustrated in FIG. 5, the alternator 140 using the rectifier 108 of the autonomous type synchronous rectification MOSFET includes a generator unit and a rectification circuit 130. The generator unit includes a rotor coil 116 and stator coils 117uv, 117vw, and 117wu.

The generator unit includes a rotor coil 116 and Δ-connected three stator coils 117uv, 117vw, and 117wu. A middle point wire of a U-phase leg 131u is extracted from a node where the stator coils 117wu and 117uv are connected. A middle point wire of a V-phase leg 131v is extracted from a node where the stator coils 117uv and 117vw are connected. A middle point wire of a W-phase leg 131w is extracted from a node where the stator coils 117vw and 117wu are connected. Note that connection of each stator coil 117uv, 117vw, and 117wu may be a Y-connection instead of the Δ-connection, and the invention is not limited thereto.

The rectification circuit 130 includes a U-phase leg 131u, a V-phase leg 131v, and a W-phase leg 131w and rectifies a three-phase AC current of the nodes Nu, Nv, and Nw into a DC current flowing between the nodes Np and Nn (between the DC terminals). The rectifiers 108ul, 108vl, and 108wl according to the first embodiment described above in conjunction with FIGS. 1 to 3 are connected to the LOW sides of the nodes Nu, Nv, and Nw. In addition, the LOW-side rectifiers 108ul, 108vl, and 108wl include rectification MOSFETs 101ul, 101vl, and 101wl, respectively, control circuits 107ul, 107vl, and 107wl, respectively, provided with the overvoltage detection and gate drive hold circuit 105 described above in conjunction with FIGS. 1 to 3, and capacitors 106ul, 106vl, and 106wl, respectively.

Rectifiers 120uh, 120vh, and 120wh different from the LOW-side rectifier 108 are connected to the HIGH sides of the nodes Nu, Nv, and Nw, respectively. In addition, the HIGH-side rectifiers 120uh, 120vh, and 120wh include rectification MOSFET 101uh, 101vh, and 101wh, respectively, control circuits 119uh, 119vh, and 119wh, respectively, different from the control circuit 107 of the LOW-side rectifier 108, and capacitors 106uh, 106vh, and 106wh, respectively.

Figure 6:
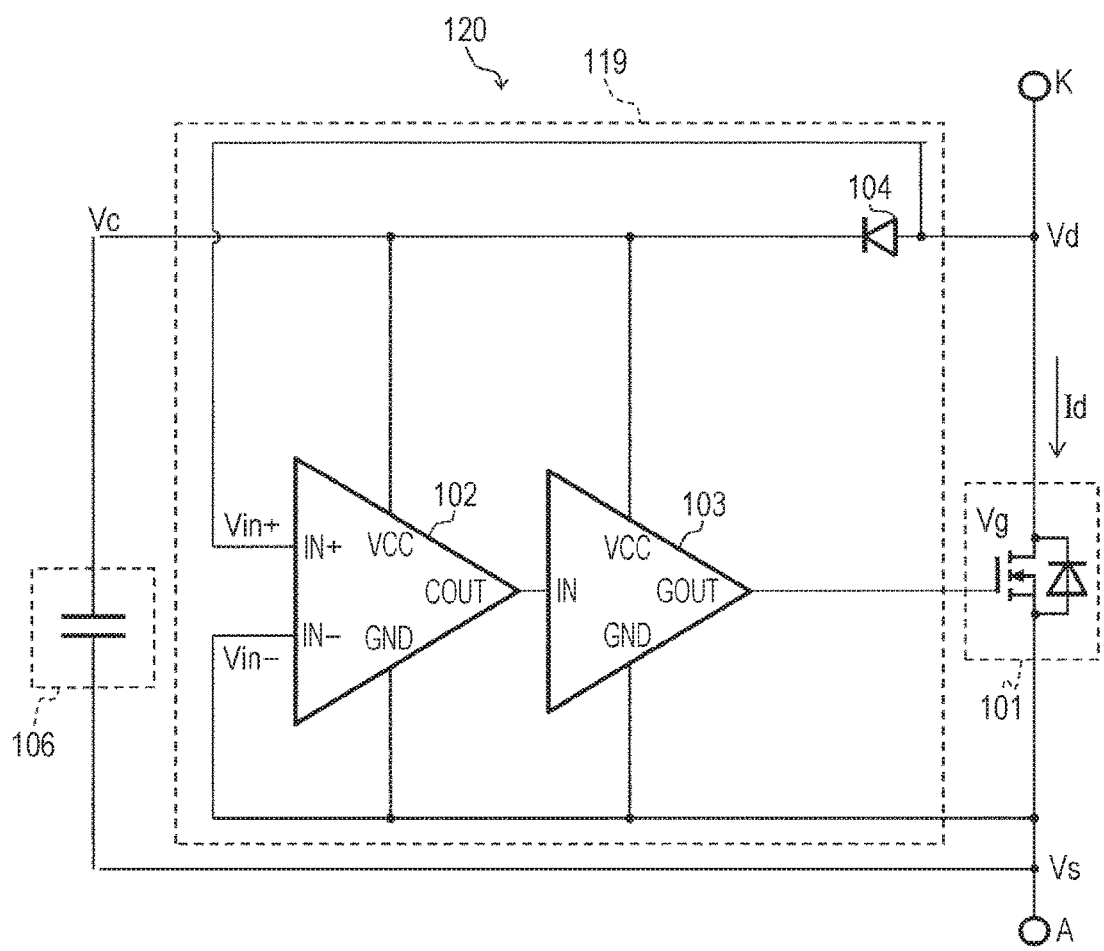
FIG. 6 is a circuit diagram illustrating a rectifier of an autonomous type synchronous rectification MOSFET used in an opposite side to that of the rectifier of the present invention.

FIG. 6 is an exemplary circuit diagram illustrating the rectifier 119 used in the HIGH side. Unlike the rectifier 108 used in the LOW side of FIG. 1, the rectifier 119 has a control circuit 119 having no overvoltage detection and gate drive hold circuit 105. In addition, basically, the same elements as those of the LOW-side rectifier 108 are used in the rectification MOSFET 101, the capacitor 106, and elements of the control circuit such as the comparator 102, the gate drive circuit 103, and the diode 104.

The HIGH-side rectifiers 120uh, 120vh, and 120wh are connected to a positive terminal of a battery 118 (energy storage) through a DC positive electrode side node Np. The LOW-side rectifiers 108ul, 108vl, and 108wl are connected to a negative terminal of the battery 118 through a DC negative electrode side node Nn.

The battery 118 (energy storage) is, for example, an on-vehicle battery having an operational range, for example, between 10.8 V and 14 V.

Hereinafter, the rectifiers 108uh to 108wl having the control circuit 107 provided with the LOW-side overvoltage detection and gate drive hold circuit 105 will be referred to as a rectifier 108 in each embodiment unless specified otherwise. In addition, the rectifiers 120uh to 120wl having the control circuit 119 having no HIGH-side overvoltage detection and gate drive hold circuit 105 will be referred to as a rectifier 120 in each embodiment unless specified otherwise. Each control circuit 107*ul* to 107*wl* will be referred to as a control circuit 107 in each embodiment unless specified otherwise. Each control circuit 119*uh* to 119*wh* will be referred to as a control circuit 119 in each embodiment unless specified otherwise. Each rectification MOSFETs 101*uh* to 101*wl* will be simply referred to as a rectification MOSFET 101 unless specified otherwise. Each capacitor 106*uh* to 106*wl* will be simply referred to as a capacitor 106 unless specified otherwise.

For connection of the rectifier, in contrast to FIG. 5, the rectifier 108 having the control circuit 107 provided with the overvoltage detection and gate drive hold circuit 105 according to the first embodiment illustrated in FIGS. 1 to 3 may be connected to the HIGH side, and the rectifier 120 having the control circuit 119 provided with no overvoltage detection and gate drive hold circuit 105 illustrated in FIG. 6 may be connected to the LOW side.

Figure 7:
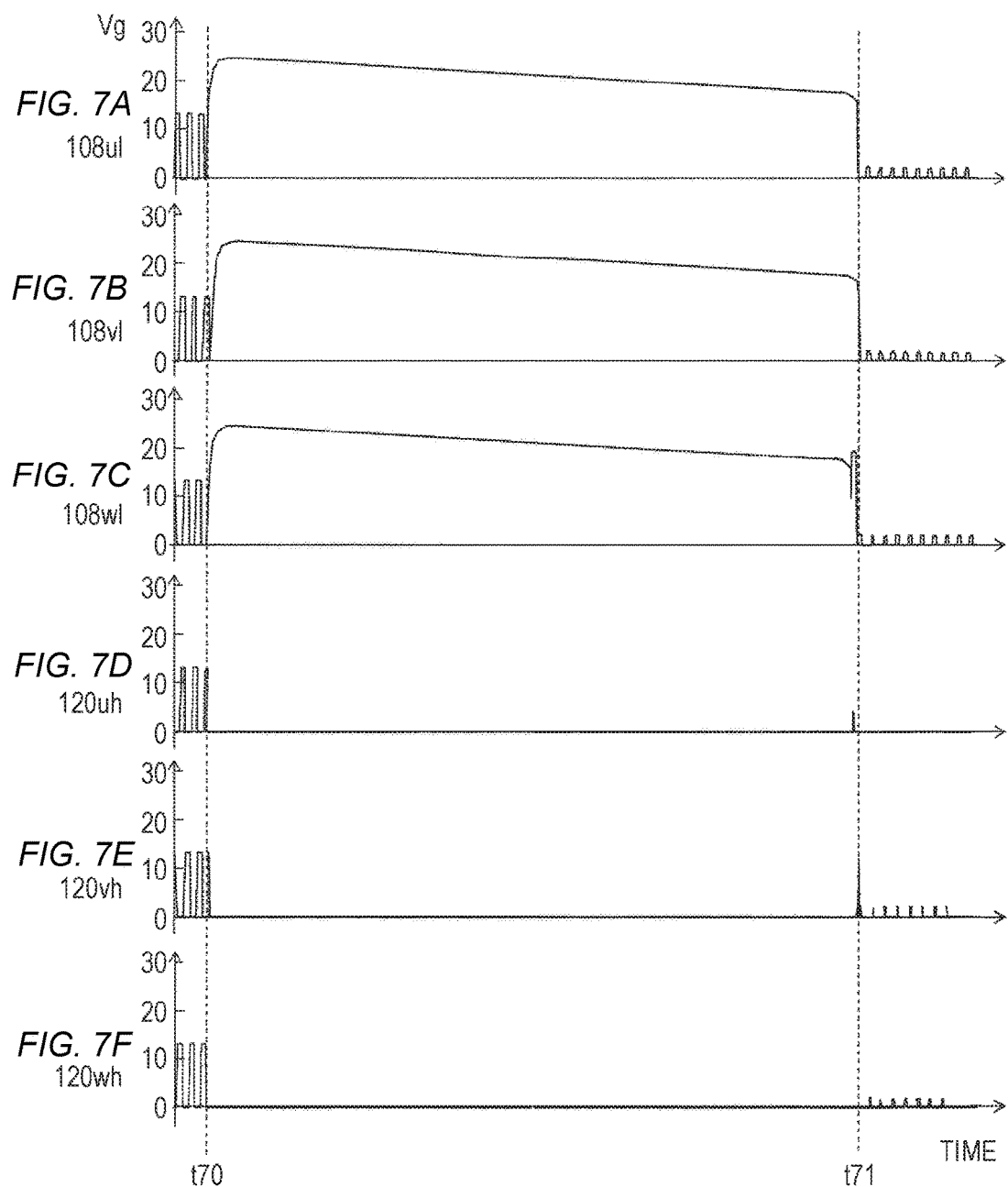
FIGS. 7A to 7F are graphs illustrating a waveform of a gate voltage of a rectification MOSFET during a load dump in the alternator having the rectifier according to the first embodiment.
Figure 8:
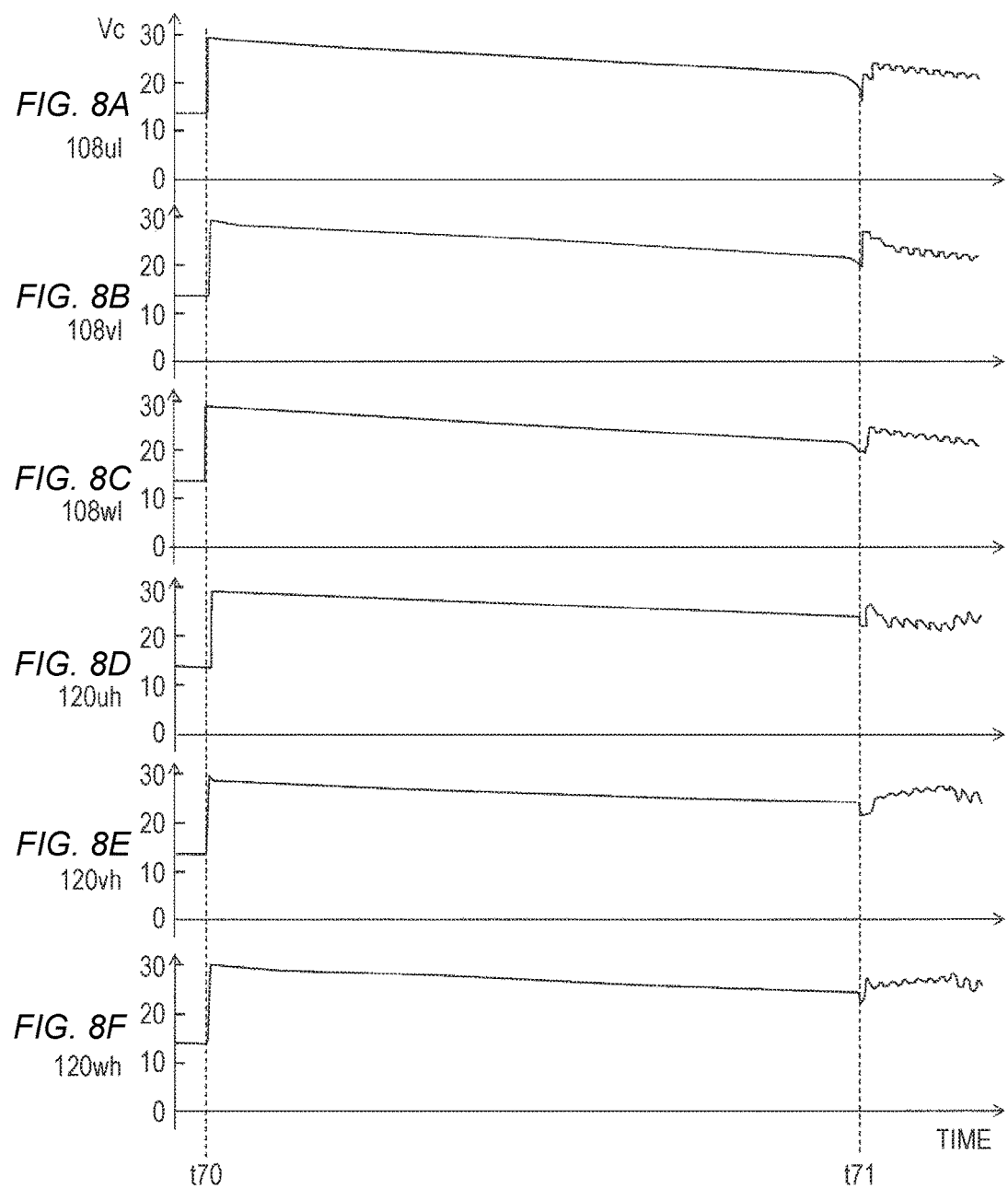
FIGS. 8A to 8F are graphs illustrating a waveform of a capacitor voltage during a load dump in the alternator having the rectifier according to the first embodiment.
Figure 9:
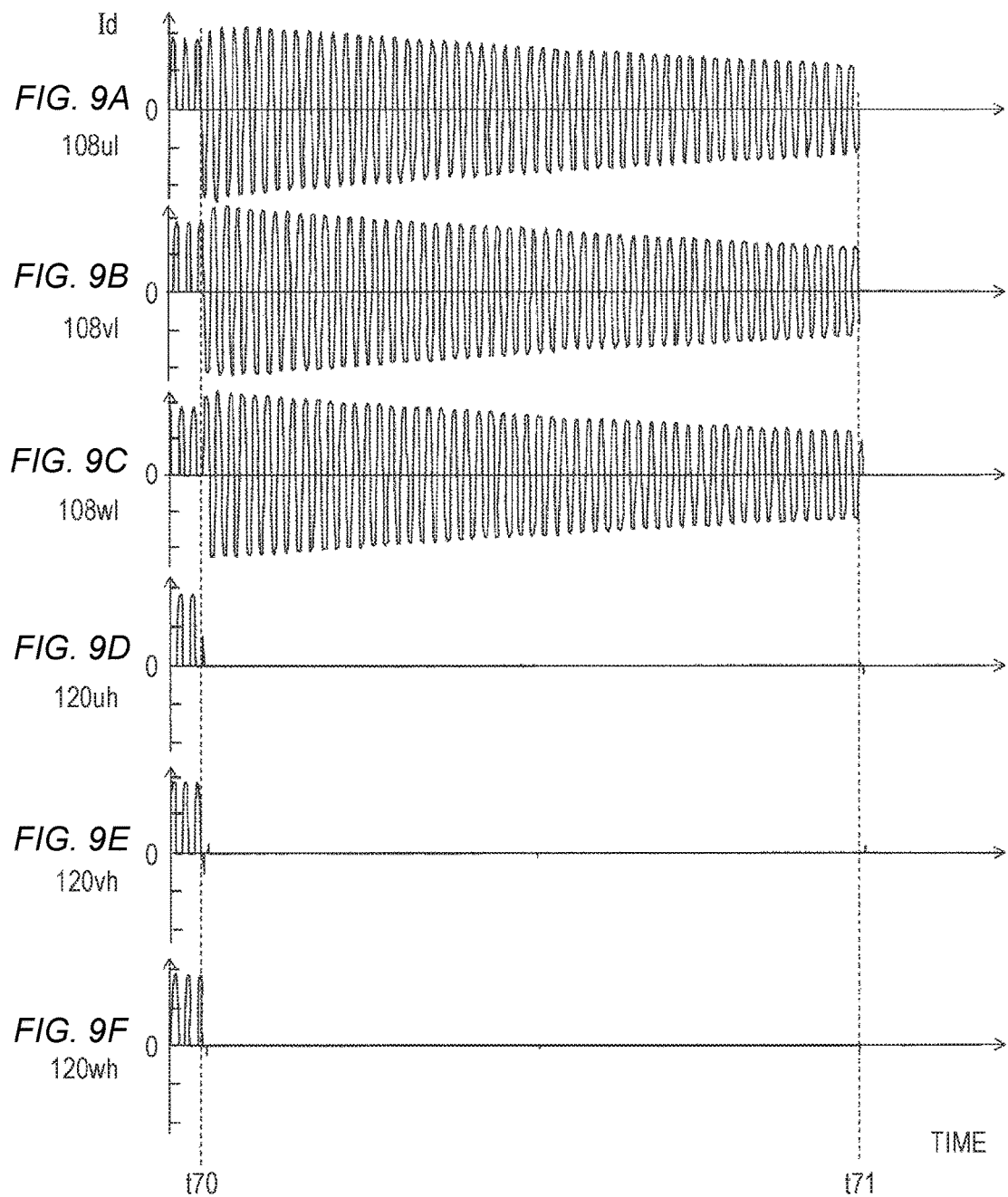
FIGS. 9A to 9F are graphs illustrating a waveform of a drain current of the rectification MOSFET during a load dump in the alternator having the rectifier according to the first embodiment.

FIGS. 7 to 9 are graphs illustrating waveforms of each part when a load dump occurs in the alternator 140 of FIG. 5 using the autonomous type rectifier 108 according to the first embodiment during a rectification operation. FIG. 7 illustrates a gate voltage Vg of the rectification MOSFET 101 of the autonomous type rectifier 108, and FIG. 8 illustrates a capacitor voltage Vc of the positive electrode of the capacitor 106 of the autonomous type rectifier 108. In addition, FIG. 9 illustrates a drain current Id of the rectification MOSFET 101 of the autonomous type rectifier 108. The graphs (a) to (f) of FIGS. 7 to 9 show voltages and currents of the LOW-side U-phase rectifiers 108*ul*, 108*vl*, and 108*wl*, and the HIGH-side rectifiers 120*uh*, 120*vh*, and 120*wh* of the alternator 140. The abscissas of all the graphs of FIGS. 7 to 9 refer to time commonly.

First, until the timing t70, a normal rectification operation is performed. The drain current Id of the rectification MOSFET 101 of FIG. 9 periodically flows to the LOW-side, the HIGH-side, the U-phase, the V-phase, and the W-phase as a rectification current. While the drain current Id of the rectification MOSFET 101 flows, the gate voltage Vg of the rectification MOSFET 101 of FIG. 7 autonomously increases to turn on the rectification MOSFET 101. As the drain current Id of the rectification MOSFET 101 completely flows, the gate voltage Vg of the rectification MOSFET 101 autonomously decreases to turn off the rectification MOSFET 101. The capacitor 106 is charged during the OFF state of the rectification MOSFET 101 and is discharged during the ON state, so that the capacitor voltage Vc of FIG. 7 is maintained at a generation voltage of the alternator 140 or its vicinity.

At the timing t70, the positive terminal of the alternator 140 and the positive terminal of the battery 118 are disconnected so as to generate a load dump. In this case, the generation current of the alternator 140 loses its destination, and the voltages Vu, Vv, Vw of the middle point wire of the U phase, the V phase, and the W phase, respectively, and the voltage of the positive terminal of the alternator 140 abruptly rise. As the voltages Vu, Vv, and Vw of the U-phase, V-phase, and W-phase middle point wires increase, the capacitors 106 of the LOW-side rectifiers 108*ul*, 108*vl*, and 108*wl* of the alternator 140 are charged, so that the capacitor voltage Vc increases as illustrated in FIG. 8. As the capacitor voltage reaches the level Vcon, the overvoltage detection and gate drive hold circuit 105 is operated, so that the gate voltage of the rectification MOSFET 101 increases to turn on the rectification MOSFET 101. If the energy generated during the load dump is large at a certain level, all of the rectification MOSFETs 101 of the LOW-side rectifiers 108 are turned on. The voltage between the positive electrode main terminal K and the negative electrode main terminal A of the LOW-side rectifier 108 decreases, and the voltages Vu, Vv, and Vw of the U-phase, V-phase, and W-phase middle point wires decrease. In contrast, in the HIGH-side rectifier 120, the voltage between the positive electrode main terminal K and the negative electrode main terminal A increases, and the control circuit 119 autonomously maintains the gate voltage of the rectification MOSFET 101 in the OFF state.

Here, in a case where the HIGH-side rectification MOSFET is turned on as the rectification current flows during the load dump, and a gate boosting rate of the rectification MOSFET 101 caused by the LOW-side overvoltage detection and gate drive hold circuit 105 is fast, both the HIGH-side rectification MOSFET 101 and the LOW-side rectification MOSFET 101 are turned on, so that a large through current flows through the HIGH-side and LOW-side rectification MOSFETs. In order to prevent this through current, it is desirable to delay the gate boosting rate of the rectification MOSFET 101 caused by the LOW-side overvoltage detection and gate drive hold circuit 105. Specifically, a current driving capability of the NMOS 1 of the overvoltage gate drive circuit 111 is lowered. That is, a gate width W of the NMOS 1 is reduced, or a gate length L is lengthened.

After turning on the LOW-side rectification MOSFET 101, the generated current of the alternator does not flow to the HIGH-side rectification MOSFET 101 having the OFF state, and flows to the LOW-side rectification MOSFET 101 having a low resistance in the ON state as illustrated in FIG. 9. The current flowing through the LOW-side rectification MOSFET is recirculated between the stator coils 117*uv*, 117*vw*, and 117*wu* and the LOW-side rectification MOSFET 101. As the energy is gradually reduced during the recirculation, the reflux current is reduced. Since the stator coil 117 has a resistance larger than that of the rectification MOSFET 101, most of the energy of the reflux current is consumed in the stator coil 117. Accordingly, it is possible to suppress heat generation in the rectification MOSFET 101.

In a case where the energy generated during the load dump is small, all of the rectification MOSFETs 101 of the LOW-side rectifiers 108 are not turned on in some cases. Even in this case, the current recirculates between the LOW-side rectification MOSFET 101 having the ON state, the internal diode of the LOW-side rectification MOSFET 101 having the OFF state, and the stator coils 117*uv*, 117*vw*, and 117*wu*, so that the energy is gradually reduced during the recirculation in a similar way, and the reflux current is reduced.

While the reflux current flows, the capacitor voltage Vc of the LOW-side rectifier 108 gradually decreases due to the current flowing to the control circuit. The gate voltage Vg of the rectification MOSFET 101 also decreases accordingly. At the timing t71 after the hold time thold elapses from the timing t70, the capacitor voltage Vc decreases to the level Vcoff, so that the overvoltage detection and gate drive hold circuit 105 is operated. In addition, the gate voltage of the rectification MOSFET 101 decreases, so that the rectification MOSFET 101 of the LOW-side rectifier 108 is turned off. In this case, the reflux current loses most of the energy, so that the voltages Vu, Vv, and Vw of the U-phase, V-phase, and W-phase middle point wires do not rise significantly, and the capacitor voltage does not reach the level Vcon in this case. In addition, a normal autonomous rectification operation is continuously performed without operating the overvoltage detection and gate drive hold circuit 105, so that the energy of the load dump is consumed, and the operation stops.

FIGS. 7 to 9 illustrate operation waveforms of the alternator 140 in which the rectifier 108 having the control circuit 107 provided with the overvoltage detection and gate drive hold circuit 105 according to the first embodiment is connected to the LOW-side of FIG. 5, and the rectifier 120 having the control circuit 119 provided with no overvoltage detection and gate drive hold circuit 105 is connected to the HIGH-side. However, reversely, even when the rectifier 108 having the control circuit 107 provided with the overvoltage detection and gate drive hold circuit 105 according to the first embodiment is connected to the HIGH-side, and the rectifier 120 having the control circuit 119 provided with no overvoltage detection and gate drive hold circuit 105 is connected to the LOW-side, the alternator 140 is similarly operated so as to consume the energy by recirculating the current. Specifically, an overvoltage of the HIGH-side rectifier 108 is detected, so that the rectification MOSFET 101 is turned on, and this state is held. In addition, the current is recirculated between the HIGH-side rectification MOSFET 101 and the stator coils 117uv, 117vw, and 117wu, and the rectification MOSFET 101 is turned off after the hold time thold elapses.

Figure 10:
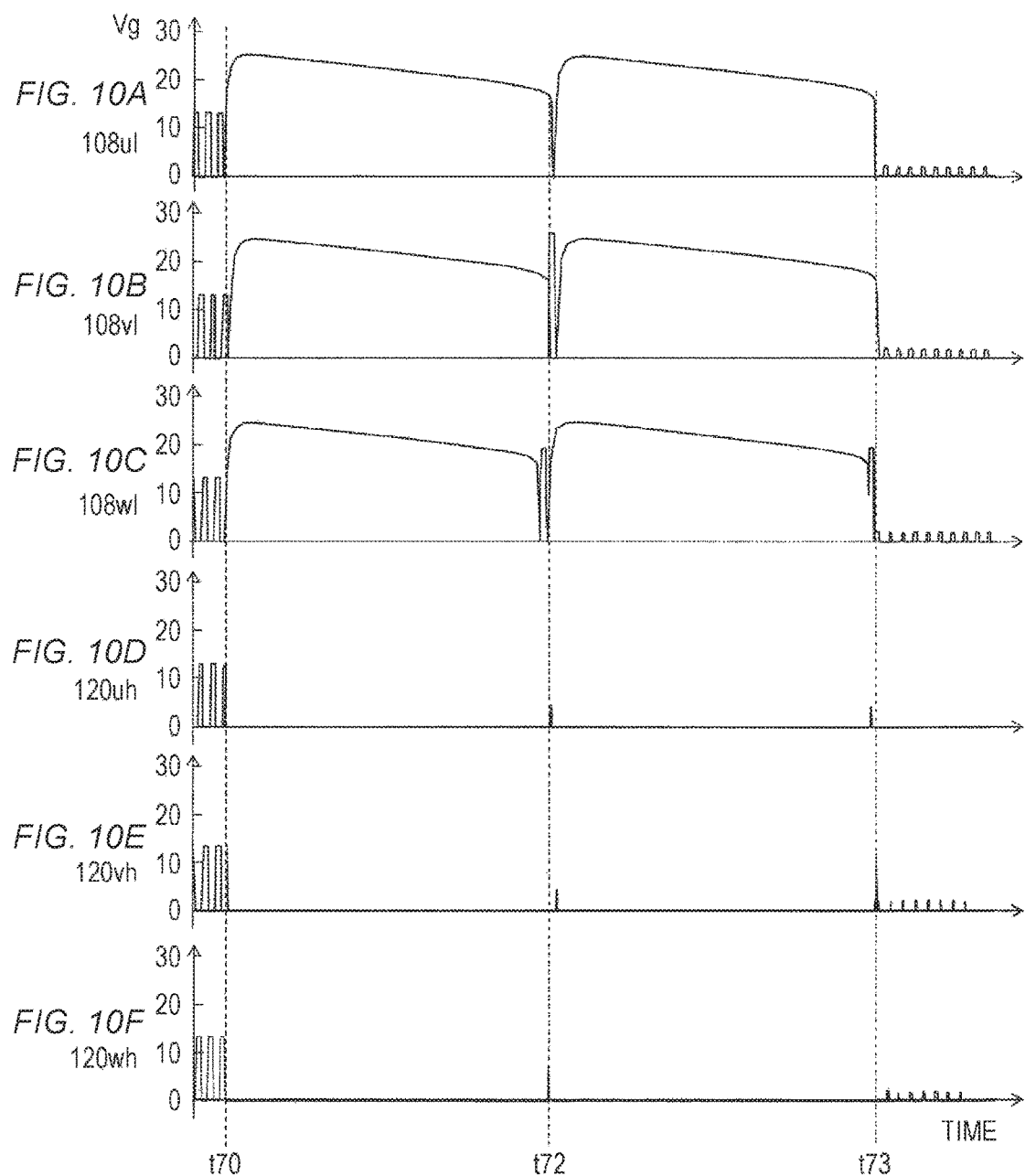
FIGS. 10A to 10F are graphs illustrating a waveform of a gate voltage of the rectification MOSFET during a load dump in an alternator having a rectifier in which an on-time thold of the rectification MOSFET according to the first embodiment is short.
Figure 11:
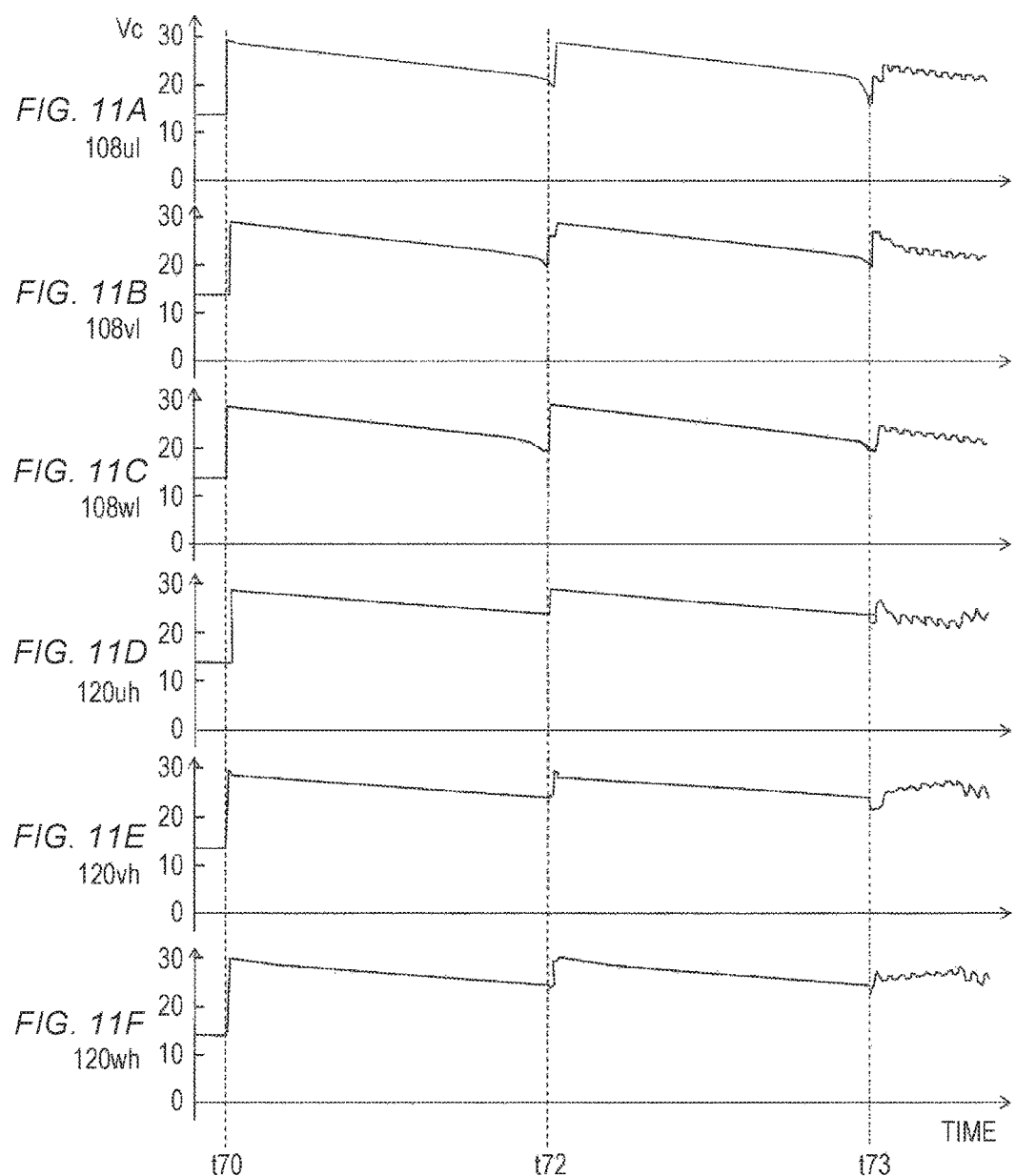
FIGS. 11A to 11F are graphs illustrating a waveform of a capacitor voltage during a load dump in an alternator having a rectifier in which the on-time thold of the rectification MOSFET according to the first embodiment is short.
Figure 12:
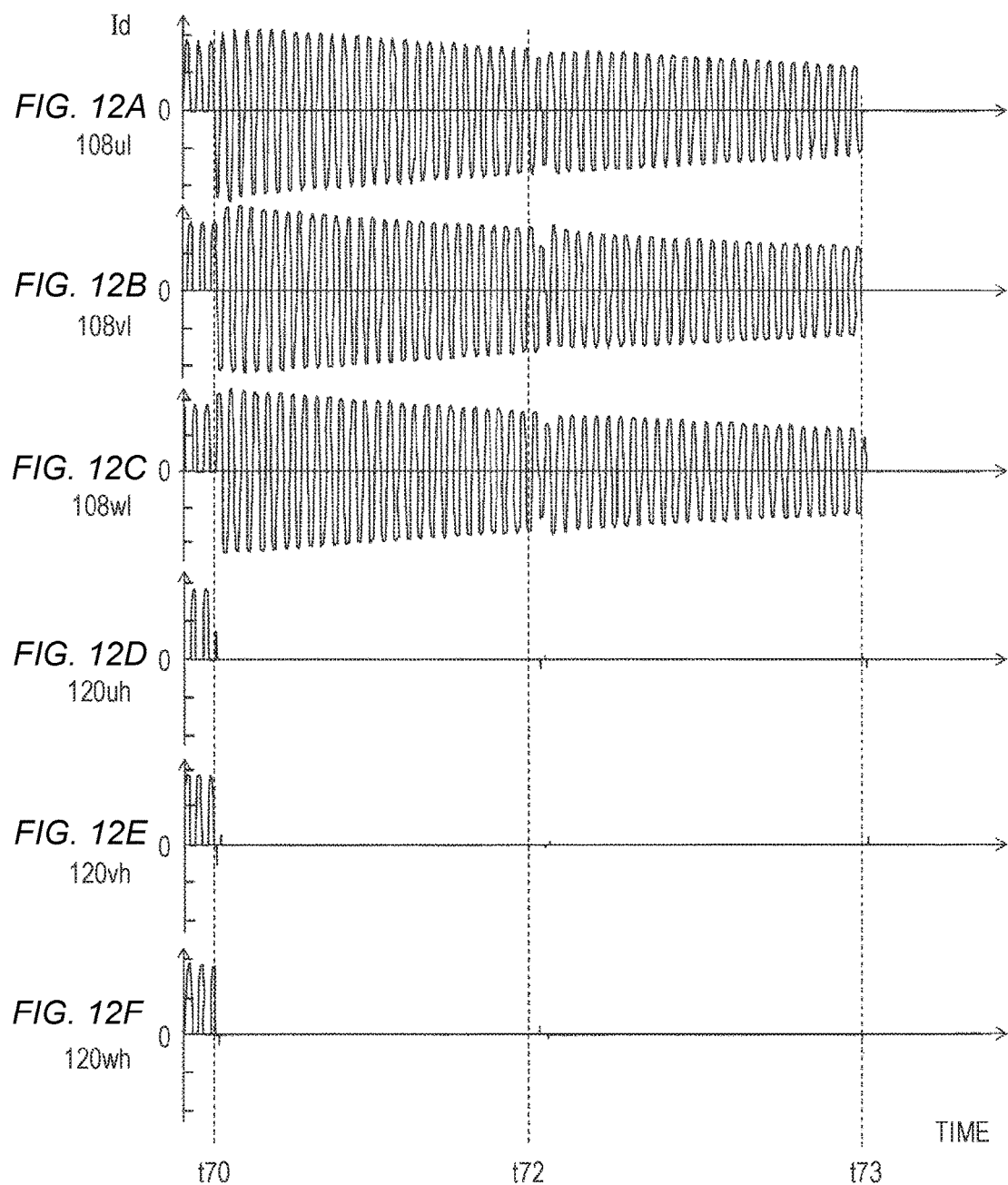
FIGS. 12A to 12F are graphs illustrating a waveform of a drain current of the rectification MOSFET during a load dump in an alternator having a rectifier in which the on-time thold of the rectification MOSFET according to the first embodiment is short.

FIGS. 7 to 9 illustrate an exemplary operation when the overvoltage detection and gate drive hold circuit 105 is employed, in which the hold time thold is designed to be longer than an energy consumption time of the load dump. It may be possible to design the hold time thold to be shorter. FIGS. 10 to 12 illustrate an exemplary operation when the overvoltage detection and gate drive hold circuit 105 is employed, in which the hold time thold is designed to be a half of the case of FIGS. 7 to 9. The graphs of FIGS. 10 to 12 correspond to the graphs of FIGS. 7 to 9.

During the period until the timing t70, a normal rectification operation is performed. If a load dump occurs at the timing t70, similar to the case of FIGS. 7 to 9, the overvoltage detection and gate drive hold circuit 105 of the LOW-side rectifier 108 is operated to turn on the rectification MOSFET 101.

A reflux current flows between the LOW-side rectification MOSFET 101 and the stator coils 117uv, 117vw, and 117wu, and the capacitor voltage Vc of the LOW-side rectifier 108 gradually decreases in the meantime. In the control circuit 107 of FIGS. 10 to 12, the hold time thold is designed to be a half, compared to that of FIGS. 7 to 9. Therefore, the capacitor voltage Vc decreases at a double rate compared to that of FIGS. 7 to 9. At the timing t72 after a half of the hold time thold/2 elapses from the timing t70, the capacitor voltage Vc decreases to the level Vcoff, and the overvoltage detection and gate drive hold circuit 105 is operated so that the gate voltage Vg of the rectification MOSFET 101 decreases, and the rectification MOSFET 101 of the LOW-side rectifier 108 is turned off.

In this case, the time for recirculating the current is short, and the energy generated from the load dump still remains, so that the reflux current loses its destination, and the voltages Vu, Vv, and Vw of the U-phase, V-phase, and W-phase middle point wires and the voltage of the positive terminal of the alternator 140 rise again. The overvoltage detection and gate drive hold circuit 105 is operated sequentially in each phase to turn on the rectification MOSFET 101. A reflux current flows between the LOW-side rectification MOSFET 101 and the stator coils 117uv, 117vw, and 117wu so that the energy of the reflux current is consumed. At the timing t73 after a half of the hold time thold/2 elapses from the timing t72, the capacitor voltage Vc decreases to the level Vcoff, and the overvoltage detection and gate drive hold circuit 105 is operated so that the gate voltage of the rectification MOSFET 101 decreases to turn off the rectification MOSFET 101 of the LOW-side rectifier 108. In this case, if the reflux current sufficiently loses the energy, the voltages Vu, Vv, and Vw of the U-phase, V-phase, and W-phase middle point wires do not rise significantly, and the capacitor voltage in this case does not reach the level Vcon. In addition, a normal autonomous rectification operation is continuously performed without operating the overvoltage detection and gate drive hold circuit 105, so that the energy of the load dump is consumed, and the operation stops. If energy remains in the reflux current, the rectification MOSFET 101 of the LOW-side rectifier 108 is turned on again, and the current is recirculated, so that this operation is repeated until the energy of the load dump is consumed.

Figure 13:
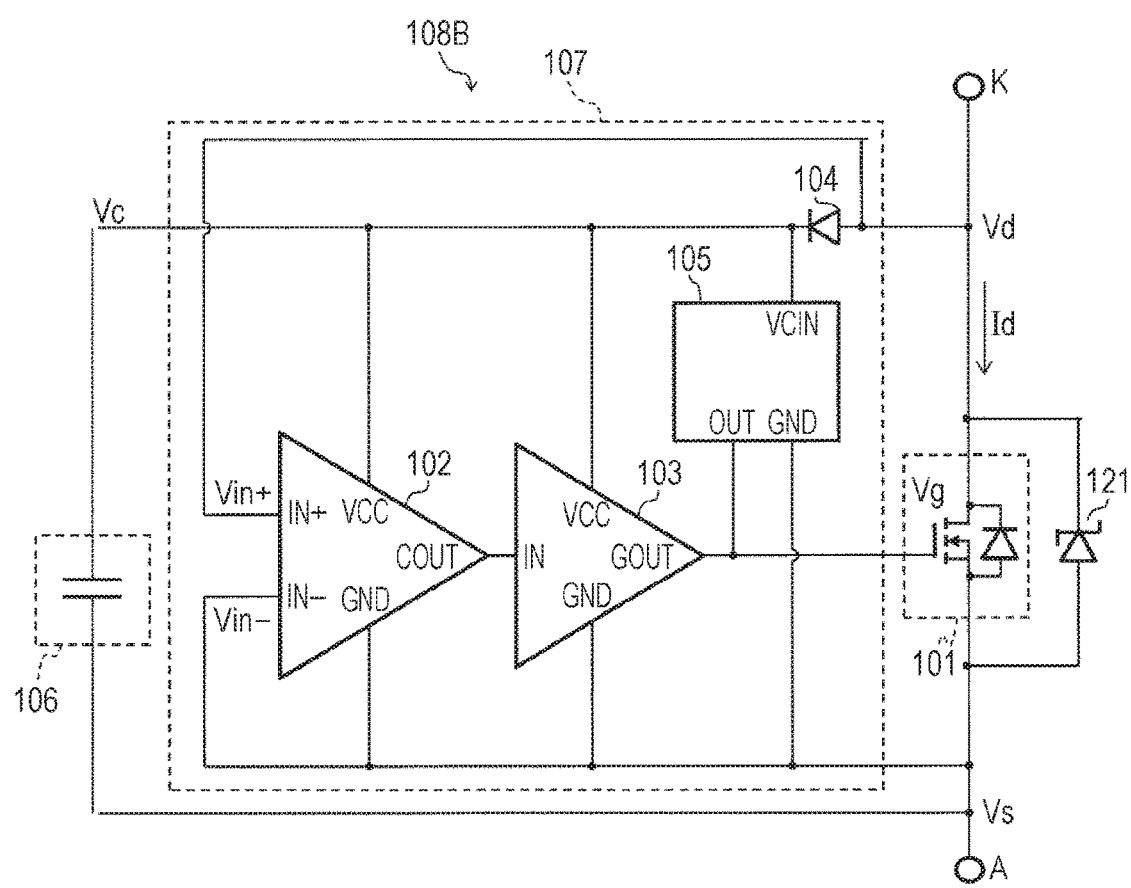
FIG. 13 is a circuit diagram illustrating a rectifier of an autonomous type synchronous rectification MOSFET according to a second embodiment.

FIG. 13 is a circuit diagram illustrating a rectifier 108B according to a second embodiment. Compared to the rectifier 108 of the first embodiment, the Zener diode 121 is connected in parallel with the rectification MOSFET 101.

In the rectifier 108 according to the first embodiment, if the voltages Vu, Vv, and Vw of the U-phase, V-phase, and W-phase middle point wires rise during a load dump rise steeply, the overvoltage detection and gate drive hold circuit 105 of the LOW-side rectifier 108 is operated, so that the voltages Vu, Vv, and Vw of the U-phase, V-phase, and W-phase middle point wires excessively rise until the rectification MOSFET 101 is turned on in some cases. In this case, a high voltage is applied to the rectification MOSFET 101 of the LOW-side rectifier 108, the control circuit 107, and the capacitor 106, so that these elements may be broken down. By providing with the Zener diode 121, the drain voltage of the rectification MOSFET 101, that is, the voltages Vu, Vv, and Vw of the U-phase, V-phase, and W-phase middle point wires are clamped. Therefore, it is possible to prevent a high voltage from being applied to these elements. In particular, in a case where the gate boosting rate of the rectification MOSFET 101 caused by the overvoltage detection and gate drive hold circuit 105 is delayed in order to prevent the through current in the HIGH-side and LOW-side rectification MOSFETs as described above, the voltage clamping using the Zener diode 121 is useful. The Zener diode 121 may be provided in parallel with the rectification MOSFET 101 as a separate chip or may be integrated into the rectification MOSFET 101.

Figure 14:
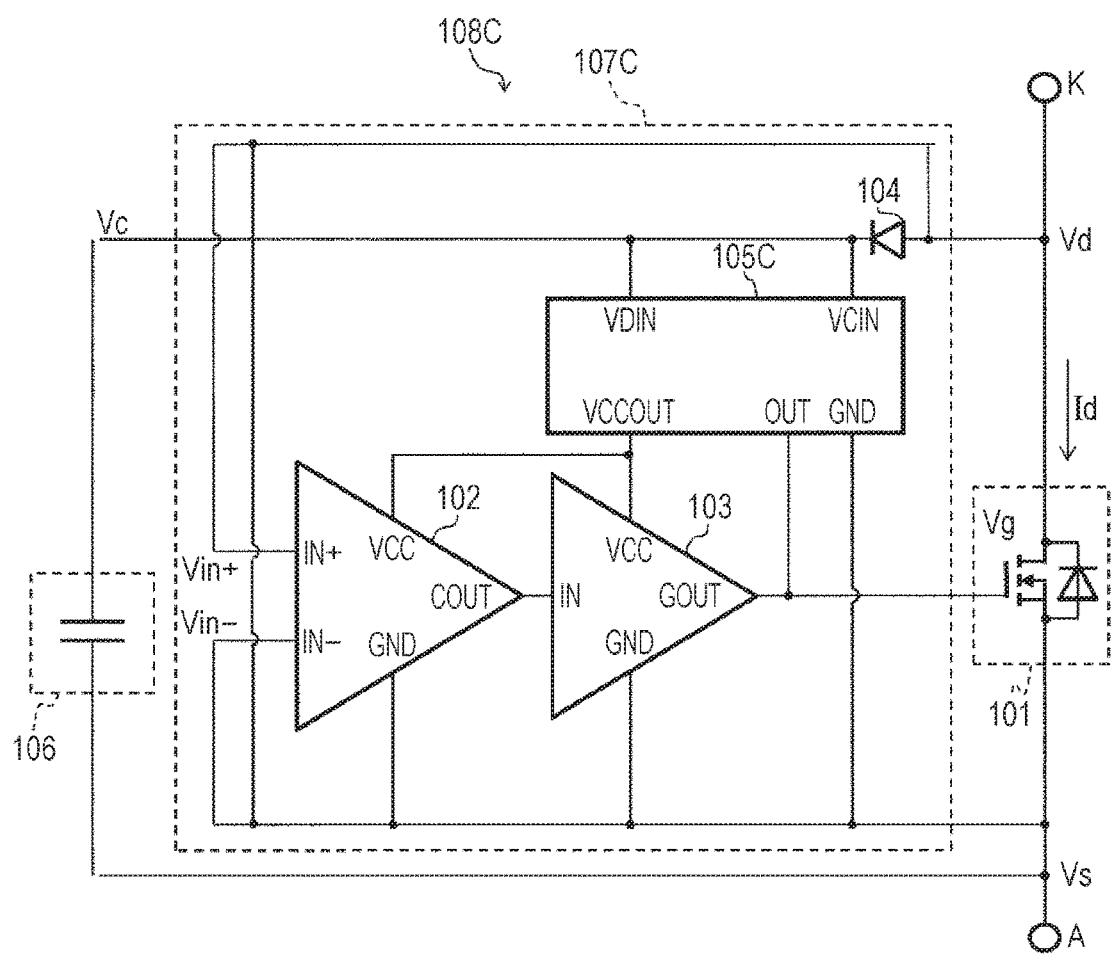
FIG. 14 is a circuit diagram illustrating a rectifier of an autonomous type synchronous rectification MOSFET according to a third embodiment.

FIG. 14 is a circuit diagram illustrating a rectifier 108C according to a third embodiment. Unlike the first embodiment of FIG. 1, the overvoltage detection and gate drive hold circuit 105C has a drain voltage input terminal VDIN and a source voltage output terminal VCCOUT, the drain voltage input terminal VDIN is connected to the drain terminal of the rectification MOSFET 101, and the source voltage output terminal VCCOUT is connected to the source voltage terminal VCC of the comparator 102 and the source voltage terminal VCC of the gate drive circuit 103.

Figure 15:
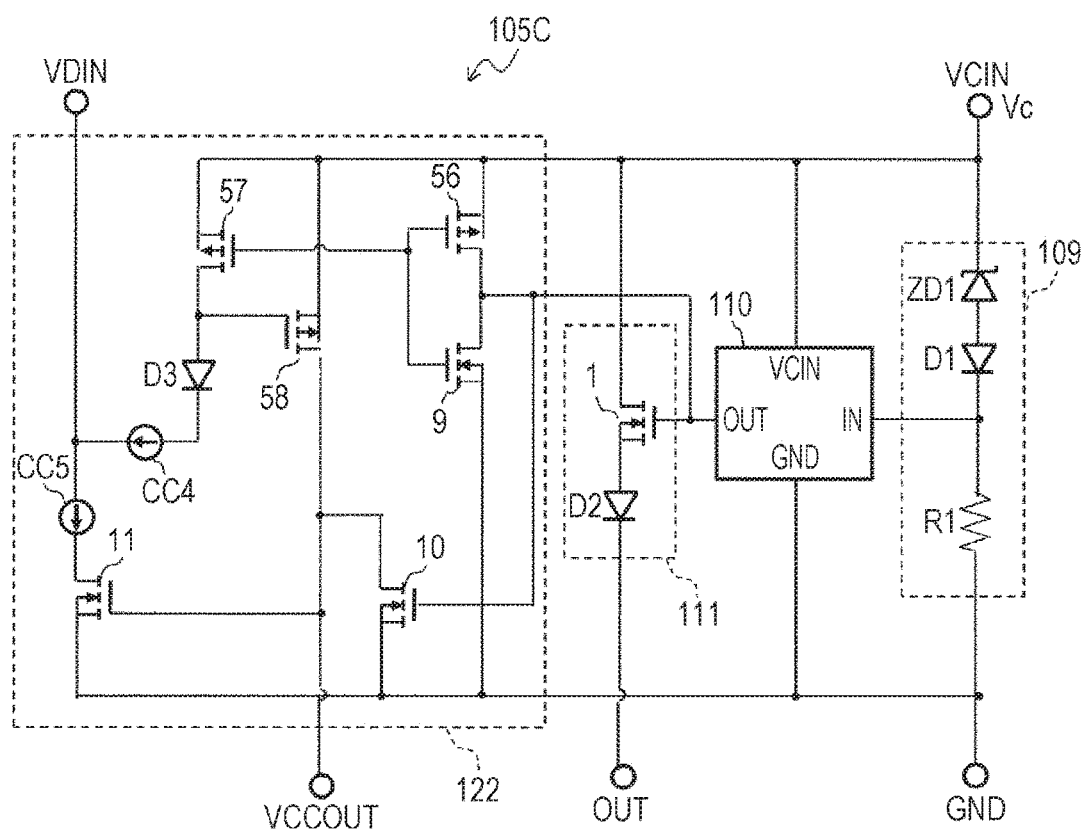
FIG. 15 is a circuit diagram illustrating an overvoltage detection and gate drive circuit provided in the rectifier of the third embodiment.

FIG. 15 is an exemplary circuit diagram illustrating an overvoltage detection and gate drive hold circuit 105C of the rectifier 108C according to the third embodiment.

The overvoltage detection and gate drive hold circuit 105C of FIG. 15 has a shut-off circuit 122, compared to the overvoltage detection and gate drive hold circuit 105 of FIG. 2. The shut-off circuit 122 includes NMOSs 9, 10, and 11, PMOSs 56, 57, and 58, a diode D3, constant current circuits CC4 and CC5.

If the drain voltage Vd of the rectification MOSFET 101 is smaller than the capacitor voltage Vc during a normal rectification operation, and the PMOS 58 of the shut-off circuit 122 is turned on, electricity is conducted between the capacitor input terminal VCIN and the source voltage output terminal VCCOUT of the overvoltage detection and gate drive hold circuit 105C, so that the capacitor voltage Vc is supplied to the source voltage terminal VCC of the comparator 102 and the source voltage terminal VCC of the gate drive circuit 103. In this state, an autonomous gate driving operation of the rectification MOSFET 101 is performed using the comparator 102 of the control circuit 107C and gate drive circuit 103. If the drain voltage Vd of the rectification MOSFET 101 is nearly equal to the capacitor voltage Vc in a normal rectification operation, and the PMOS 56 of the shut-off circuit 122 is turned off, a shut-off state is established between the VCIN terminal of the overvoltage detection and gate drive hold circuit 105b and the source voltage output terminal VCCOUT, so that the capacitor voltage Vc is not supplied to the source voltage terminal VCC of the comparator 102 and the source voltage terminal VCC of the gate drive circuit 103.

Here, if an overvoltage of the load dump is applied to the positive electrode main terminal K of the rectifier 108C, the overvoltage detection and gate drive hold circuit 105C detects the overvoltage, and the hold circuit 110 outputs a high voltage to the output terminal OUT to boost the gate of the rectification MOSFET 101. In this case, an inverter including the PMOS 56 and the NMOS 9 of the shut-off circuit 122 outputs a low voltage to turn on the PMOS 57. As a result, the PMOS 58 is turned off, and the capacitor voltage Vc is not supplied to the source voltage terminal VCC of the comparator 102 and the source voltage terminal VCC of the gate drive circuit 103. In addition, in this case, the NMOS 10 is turned on. As a result, the source voltage terminal VCC of the comparator 102 and the source voltage terminal VCC of the gate drive circuit 103 are short-circuited to the source voltage Vs of the rectification MOSFET 101.

As a first advantage of the rectifier 108C according to the third embodiment, the hold time thold for holding the ON state of the rectification MOSFET 101 in the overvoltage detection and gate drive hold circuit 105C during a load dump can be lengthened. This is because the capacitor voltage Vc is not supplied to the source voltage terminal VCC of the comparator 102. Accordingly, it is possible to suppress a decrease of the capacitor voltage Vc. This effect is remarkable when the current of the source terminal of the comparator is large. It is not necessary to increase the capacity of the capacitor 106 in order to lengthen the hold time thold, and it is possible to reduce the mount area.

As a second advantage of the rectifier 108C according to the third embodiment, it is possible to reduce the current flowing to drive the gate boosting of the rectification MOSFET 101 during a load dump. This is because the capacitor voltage Vc is not supplied to the source voltage terminal VCC of the gate drive circuit 103, and the source voltage terminal VCC of the gate drive circuit 103 is short-circuited to the source terminal of the rectification MOSFET 101. In this state, the gate-source voltage of the PMOS and the NMOS of the CMOS buffer in the final stage included in the gate drive circuit 103 becomes zero, so that all of them are turned off. As a result, it is possible to boost the gate of the rectification MOSFET 101 with a small current without increasing a gate resistance connected to the output terminal OUT of the gate drive circuit 103. Therefore, it is possible to reduce a gate resistance and a delay in the gate driving in a normal rectification operation. If the gate terminals of the PMOS and the NMOS of the CMOS buffer in the final stage of the gate drive circuit 103 are short-circuited to the source terminal of the rectification MOSFET 101 in addition to the source voltage terminal VCC of the gate drive circuit 103, it is possible to prevent an increase of the gate voltage using the gate capacitances of the PMOS and the NMOS of the CMOS buffer of the final stage. Therefore, it is possible to secure the second advantage.

The first and second advantages can be obtained independently. When it is desired to obtain only one of the advantages, a configuration for this purpose may be possible. Specifically, if it is desired to obtain only the first advantage, the source voltage output terminal VCCOUT of the overvoltage detection and gate drive hold circuit 105C is connected to only the source voltage terminal VCC of the comparator 102, and the source voltage terminal VCC of the gate drive circuit 103 is directly connected to the positive terminal of the capacitor 106. In addition, the NMOS 10 of the overvoltage detection and gate drive hold circuit 105C is not necessary. If it is desired to obtain only the second advantage, the source voltage output terminal VCCOUT of the overvoltage detection and gate drive hold circuit 105C is connected to only the source voltage terminal VCC of the gate drive circuit 103, and the source voltage terminal VCC of the comparator is directly connected to the positive terminal of the capacitor 106.

Figure 16:
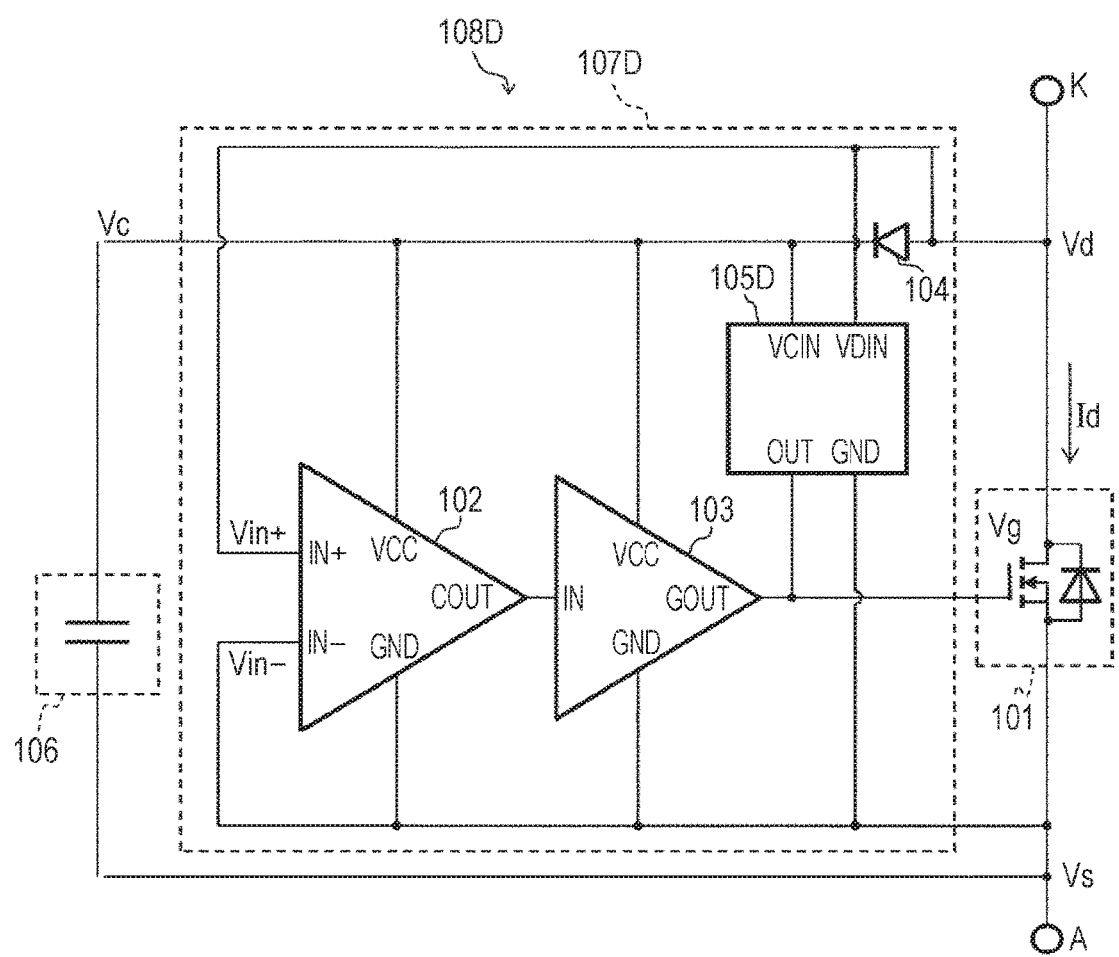
FIG. 16 is a circuit diagram illustrating a rectifier of an autonomous type synchronous rectification MOSFET according to a fourth embodiment.

FIG. 16 is a circuit diagram illustrating a rectifier 108D according to a fourth embodiment. The rectifier 108D according to the fourth embodiment is different from the rectifier 108 of the first embodiment in that the overvoltage detection and gate drive hold circuit 105D has a drain voltage input terminal VDIN.

Figure 17:
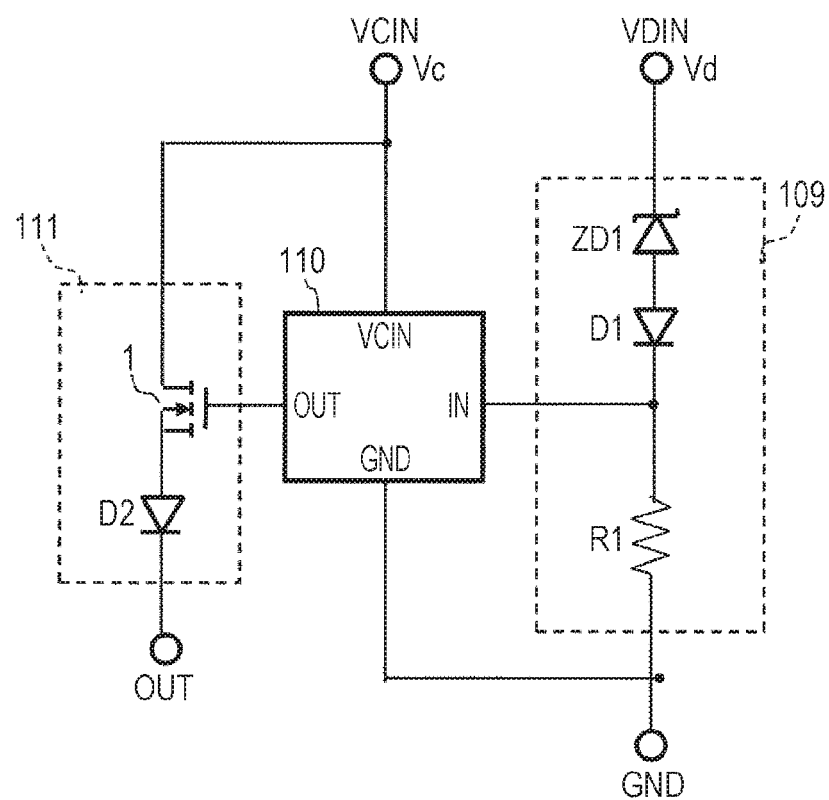
FIG. 17 is a circuit diagram illustrating an overvoltage detection and gate drive circuit provided in the rectifier of the fourth embodiment.

FIG. 17 is an exemplary circuit diagram illustrating the overvoltage detection and gate drive hold circuit 105D of the rectifier 108D according to the fourth embodiment.

The overvoltage detection and gate drive hold circuit 105D of FIG. 17 is different from the overvoltage detection and gate drive hold circuit 105 of FIG. 2 in that the Zener diode ZD is connected to the drain voltage input terminal VDIN. Similar to the circuit of FIG. 2, the source voltage terminal VCC of the hold terminal and the NMOS 1 of the overvoltage gate drive circuit 111 are connected to the capacitor voltage input terminal VCIN.

When an overvoltage is applied to the positive electrode main terminal K of the rectifier 108 in a load dump, the current flows through the diode 104 and charges the capacitor 106 in the rectifier 108 illustrated in FIGS. 1 and 2. After the capacitor voltage Vc increases, the Zener diode ZD of the overvoltage detection circuit 109 is driven to turn on the rectification MOSFET. The turning-on of the rectification MOSFET 101 is delayed as long as the time for charging the capacitor 106. In comparison, in the rectifier 108D of FIGS. 15 and 16, as the voltage of the positive electrode main terminal K increases, the voltage of the drain terminal of the rectification MOSFET increases accordingly, so that the Zener diode ZD of the overvoltage detection circuit 109 is driven to turn on the rectification MOSFET. Therefore, it is possible to turn on the rectification MOSFET 101 fast as early as the time for charging the capacitor 106 is not necessary. It is possible to turn on the rectification MOSFET 101 before the voltage of the positive electrode main terminal K increases. Therefore, it is possible to prevent an overvoltage from being applied to and breaking down other elements such as the MOSFET, the control circuit, and the capacitor. The turn-off operation of the HIGH-side rectification MOSFET is expedited so as not to flow the through current to the HIGH-side and LOW-side rectification MOSFETs 101 when the LOW-side rectification MOSFET is turned on.

Figure 18:
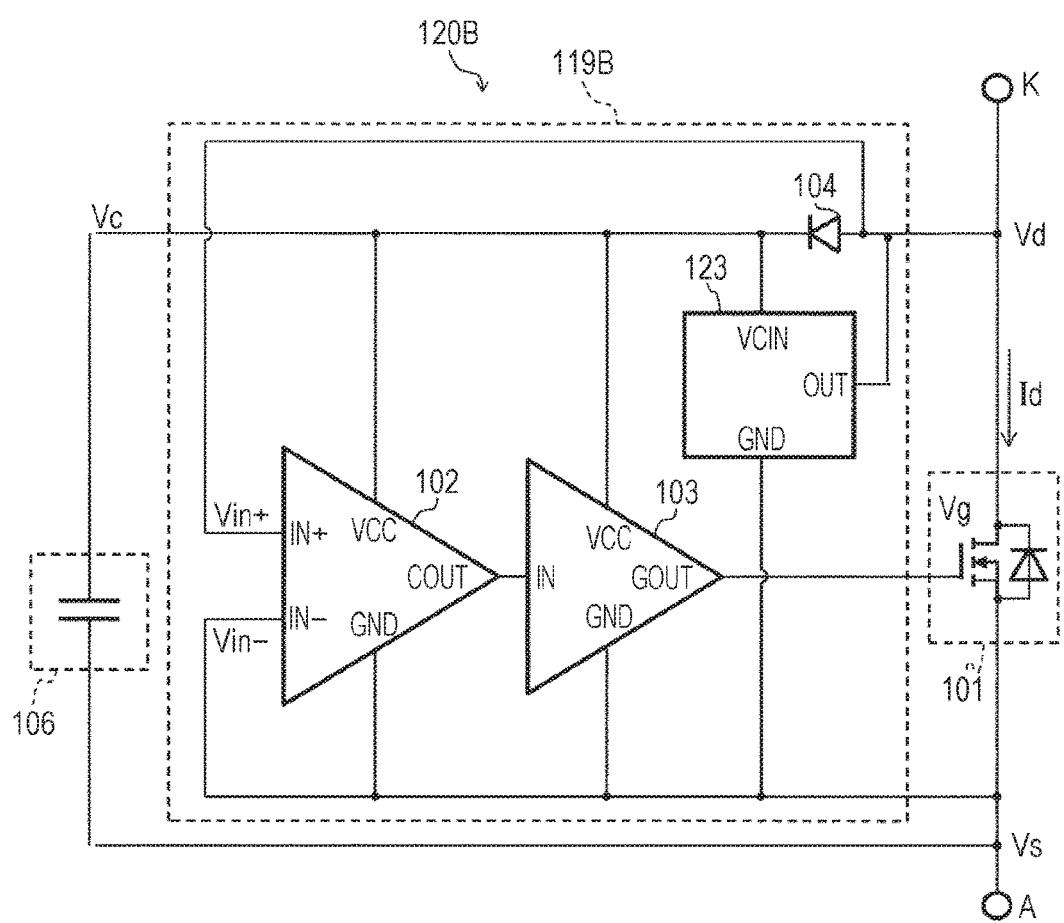
FIG. 18 is a circuit diagram illustrating a rectifier of an autonomous type synchronous rectification MOSFET provided in an overvoltage detection and capacitor open circuit used in the opposite side to that of the rectifier of the present invention.

FIG. 18 is a circuit diagram illustrating a rectifier 120B as another embodiment of the rectifier 120 used in the HIGH-side of the alternator 140 of FIG. 6. Unlike the HIGH-side rectifier 120 of the alternator 104 of FIG. 6, the control circuit 119B of the rectifier 120*b* has an overvoltage detection and capacitor connection circuit 123.

In the overvoltage detection and capacitor connection circuit 123, the capacitor voltage input terminal VCIN is connected to the positive terminal of the capacitor 106, the ground terminal GND is connected to the source of the rectification MOSFET 101, and the output terminal OUT is connected to the drain of the rectification MOSFET 101.

The overvoltage detection and capacitor connection circuit 123 detects an overvoltage in the drain voltage Vd of the rectification MOSFET 101 during a load dump and connects a current path from the capacitor 106 to the drain of the rectification MOSFET 101, so that this state is held for a certain time.

Figure 19:
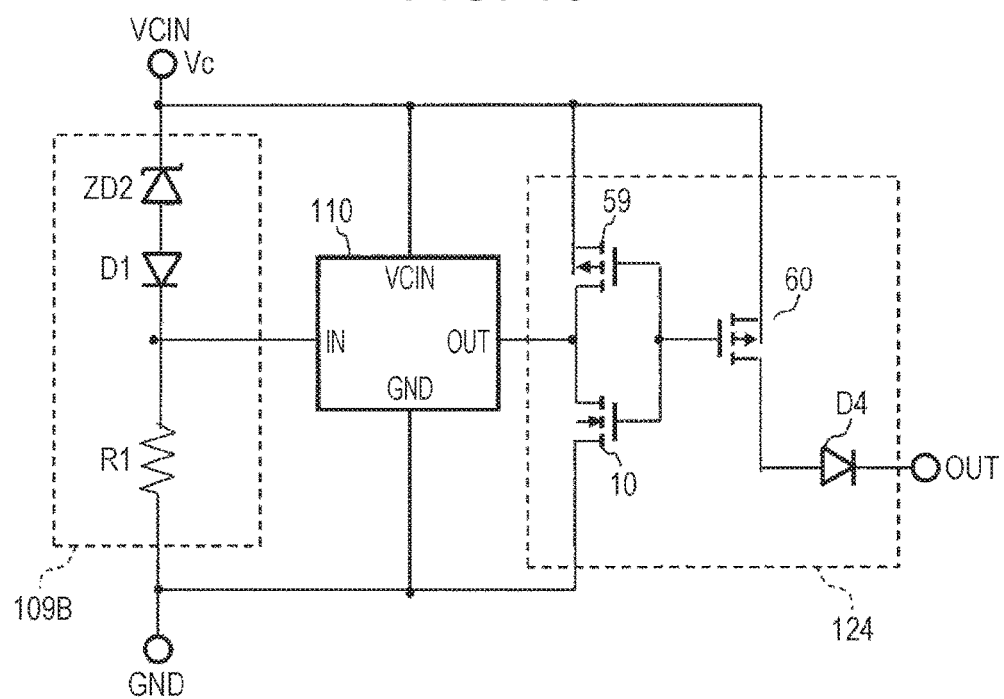
FIG. 19 is a circuit diagram illustrating an overvoltage detection and capacitor open circuit of a rectifier used in the opposite side to that of the rectifier of the present invention.

FIG. 19 is an exemplary circuit diagram illustrating the overvoltage detection and capacitor connection circuit 123 of the rectifier 120B.

The overvoltage detection and capacitor connection circuit 123 has an overvoltage detection circuit 109B and a hold circuit 110 having the same circuit configurations as those of the overvoltage detection and gate drive hold circuit 105 of FIG. 2 to connect the output terminal OUT of the hold circuit 110 to a capacitor connection circuit 124. The capacitor connection circuit 124 has an inverter including a PMOS 59 and an NMOS 10, a PMOS 60, and a diode D4. A gate of the PMOS 60 is connected to a gate of the PMOS 59 of the inverter. The capacitor connection circuit 124 has the PMOS 60 and the diode D4. The output terminal OUT of the hold circuit 110 is input to the inverter, and the output of the inverter is connected to the gate of the PMOS 6. The hold circuit 110 uses the same circuit as that of the hold circuit 110 of FIG. 3.

As the LOW-side rectifier 108 is turned on in a load dump, the voltage between the positive electrode main terminal K of the LOW-side rectifier 108 and the negative electrode main terminal A decreases, and the voltage between the positive electrode main terminal K of the HIGH-side rectifier 120 and the negative electrode main terminal A increases. In addition, the capacitor voltage Vc of the HIGH-side rectifier 120 increases, so that the Zener diode ZD2 is driven to increase the voltage of the input terminal IN of the hold circuit 110. In addition, a high voltage is output to the output terminal OUT of the hold circuit 110, and the PMOS 60 of the capacitor connection circuit 124 is turned on, so that the capacitor voltage input terminal VCIN of the overvoltage detection and capacitor connection circuit 123 and the output terminal OUT are connected through the diode D4. In addition, this connection state is held by the hold circuit 110. As a result, when the positive electrode main terminal K of the HIGH-side rectifier 120 decreases, the current from the capacitor 106 of the HIGH-side rectifier 120 flows to the positive electrode main terminal K, so that the voltage between the positive electrode main terminal K of the rectifier 120 and the negative electrode main terminal A is maintained at the capacitor voltage Vc within a capacitance range of the capacitor 106.

Similar to the LOW-side rectifier 108, as the capacitor voltage Vc decreases, the capacitor voltage input terminal VCIN of the overvoltage detection and capacitor connection circuit 123 and the output terminal OUT are disconnected from each other.

It is necessary to turn on the rectification MOSFET of the LOW-side rectifier 108 after the connection of the capacitor to the positive electrode main terminal K of the HIGH-side rectifier 120B. Therefore, the Zener voltage of the Zener diode ZD2 of the overvoltage detection circuit 109B of the overvoltage detection and capacitor connection circuit 123 is designed to be higher than the Zener voltage of the Zener diode ZD1 of the overvoltage detection circuit 109 of the LOW-side overvoltage detection and gate drive hold circuit 105.

Figure 20:
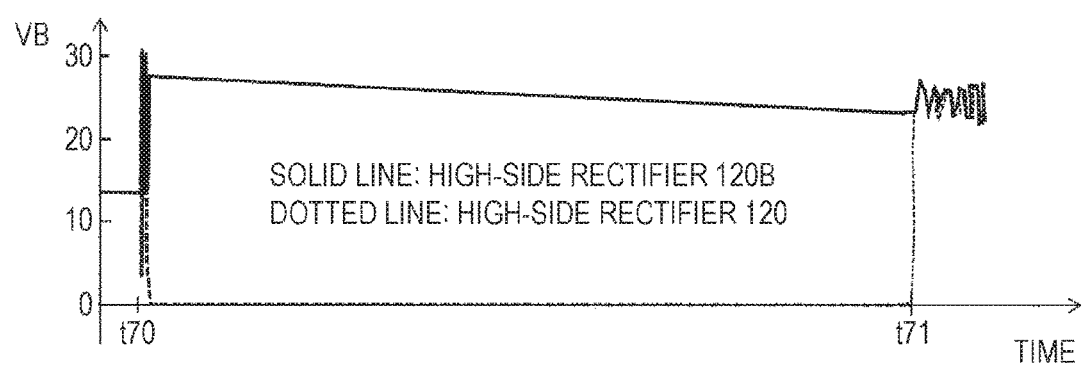
FIG. 20 is a graph illustrating a waveform of a voltage in a B terminal during a load dump in an alternator having a rectifier of an autonomous type synchronous rectification MOSFET having an overvoltage detection and capacitor open circuit used in the opposite side to that of the rectifier of the present invention in the HIGH side.

FIG. 20 is a graph illustrating a voltage VB of an external terminal of the positive electrode side of the alternator when a load dump occurs in a rectification operation in the alternator 140 in which the rectifier 120B of FIG. 18 and the rectifier 120 of FIG. 6 are used in the HIGH side. The solid line refers to a case where the rectifier 120B of FIG. 18 is used, and the dotted line refers to a case where the rectifier 120 of FIG. 6 is used. The abscissa refers to time common to FIGS. 7 to 9.

As the rectification MOSFET of the LOW-side rectifier 108 is held in the ON state at the timing t70, in the HIGH-side rectifier 120, the voltage VB of the external terminal of the positive electrode side of the alternator decreases within a short time due to a leakage current of the rectification MOSFET 101 of the HIGH-side rectifier 120. As a result, power is not supplied to a device connected to the external terminal of the positive electrode side of the alternator while the rectification MOSFET of the LOW-side rectifier 108 remains in the ON state. In comparison, in the HIGH-side rectifier 120B, the overvoltage detection and capacitor connection circuit 123 is operated, so that the voltage VB of the external terminal of the positive electrode side of the alternator is held in a high voltage due to the voltage of the capacitor 106 of the HIGH-side rectifier 120B. As a result, while the rectification MOSFET of the LOW-side rectifier 108 remains in the ON state, it is possible to supply power source to a device connected to the external terminal of the positive electrode side of the alternator.

Figure 21:
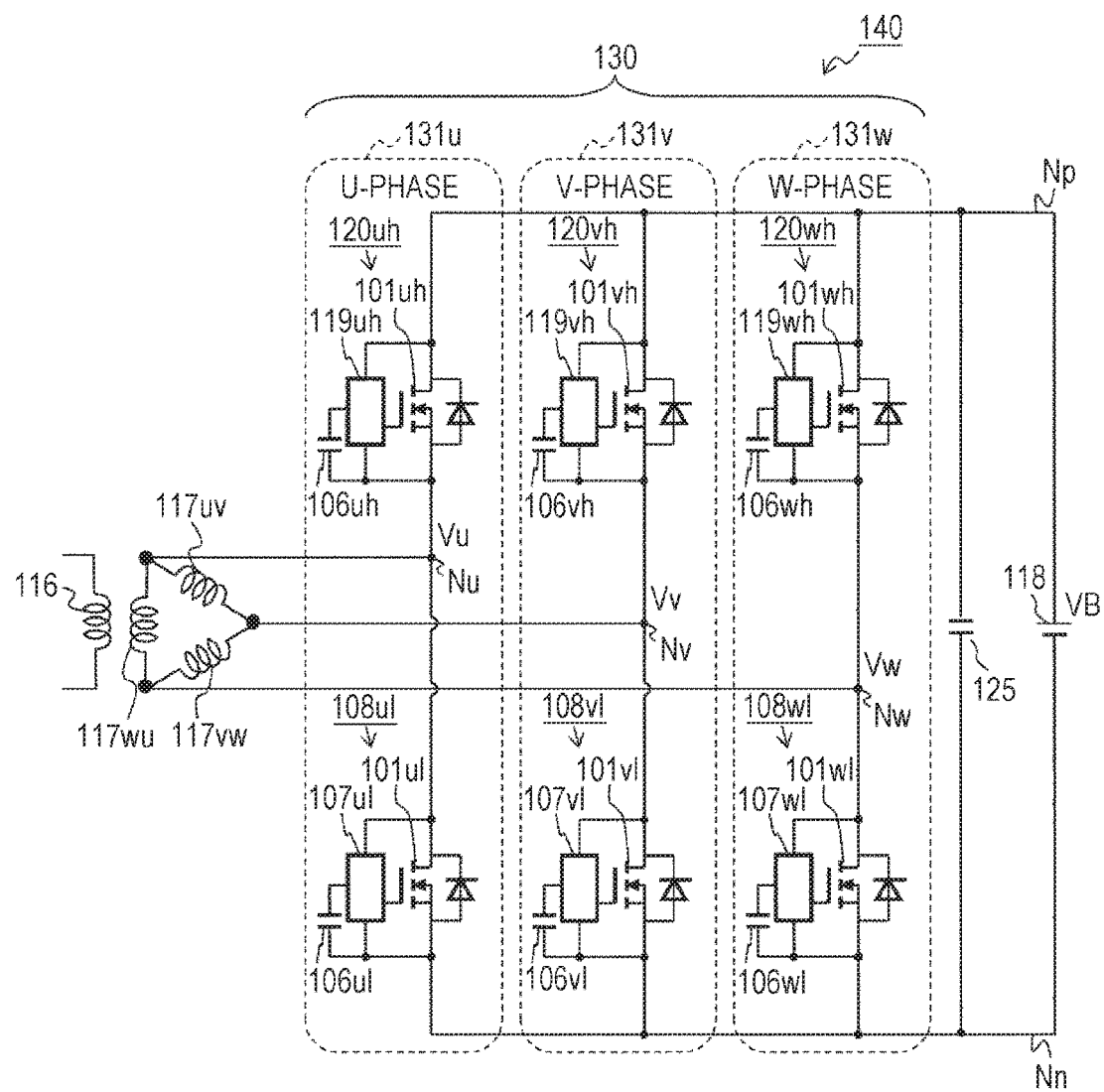
FIG. 21 is a circuit diagram illustrating a modification of the alternator having the rectifier of the present invention.

A capacitance of the capacitor 106 of the HIGH-side rectifier 120B is set to a necessary value in order to hold the voltage VB of the external terminal of the positive electrode side of the alternator. In a case where its capacitance is too large, and a package of the rectifier 120B is not stabilized, a capacitor 125 for holding the voltage VB of the external terminal of the positive electrode side of the alternator may be provided between the external terminal Np of the positive electrode side of the alternator and the external terminal Nn of the negative electrode side as illustrated in FIG. 21. This capacitor may be provided between the external terminal Np of the positive electrode side of the alternator and the middle points Nu, Nv, and Nw.

The present invention is not limited to the aforementioned embodiments, but includes various modifications. For example, the aforementioned embodiments have been described in details in order to explain the present invention in an easy-to-understand manner, and are not necessarily limited to those having all the configurations described above. A part of the configuration of an embodiment may be replaced with a configuration of another embodiment, and a configuration of an embodiment may be added to a configuration of another embodiment. Further, additions, deletions, and substitutions may also be possible for a part of the configuration of each embodiment.

In each embodiment, a control line or an information line indicates what is considered to be necessary for the explanation, and all the control lines and information lines are not always shown on the product. In fact, it may be considered that most of the configurations are connected to each other.

What is claimed is:

1. A rectifier comprising:
a metal oxide semiconductor field effect transistor (MOSFET) configured to perform rectification;
a control circuit configured to receive a voltage between a pair of main terminals of the MOSFET and perform an on/off operation of the MOSFET on the basis of the voltage between the pair of main terminals;
a power source configured to supply a source voltage to the control circuit; and
a hold circuit, an output of which is connected to a gate of the MOSFET, configured to boost a gate voltage of the MOSFET when an internal trigger voltage of the control circuit is equal to or higher than a first voltage, and hold the boosted state for a period independent from a voltage between the pair of main terminals.

2. The rectifier according to claim 1,
wherein the power source is a capacitor.

3. The rectifier according to claim 2,
having only a pair of external terminals which are connected to the pair of main terminals of the MOSFET that performs rectification.

4. The rectifier according to claim 2,
wherein the trigger voltage is a voltage of the capacitor.

5. The rectifier according to claim 4,
wherein the gate voltage of the MOSFET is reduced when the capacitor voltage is equal to or lower than a second voltage which is lower than the first voltage.

6. The rectifier according to claim 1,
wherein
the control circuit has a Zener diode, and
it is detected that the trigger voltage is equal to or higher than the first voltage by the Zener diode.

7. The rectifier according to claim 1,
wherein the hold circuit has a latch circuit.

8. The rectifier according to claim 1,
further comprising a Zener diode connected in parallel with the MOSFET that perform rectification.

9. The rectifier according to claim 1,
wherein the control circuit has a decision circuit, and a shut-off circuit that electrically disconnects the power source and the decision circuit when the trigger voltage is equal to or higher than the first voltage.

10. The rectifier according to claim 1,
wherein the control circuit has a gate drive circuit, and a shut-off and short-circuit circuit that electrically disconnects the power source and the gate drive circuit and short-circuits a source voltage terminal of the gate drive circuit and the source terminal of the MOSFET when the trigger voltage is equal to or higher than the first voltage.

11. A rectifier comprising:
a metal oxide semiconductor field effect transistor (MOSFET) configured to perform rectification;
a control circuit configured to receive a voltage between a pair of main terminals of the MOSFET and perform an on/off operation of the MOSFET on the basis of the voltage between the pair of main terminals;
a power source configured to supply a source voltage to the control circuit; and
a hold circuit, an output of which is connected to a gate of the MOSFET, configured to boost a gate voltage of the MOSFET when an internal trigger voltage of the control circuit is equal to or higher than a first voltage, turn on the MOSFET, and hold the on-state of the MOSFET for a period independent from a voltage between the pair of main terminals.

12. The rectifier according to claim 11,
wherein the power source is a capacitor.

13. The rectifier according to claim 12,
having only a pair of external terminals which are connected to the pair of main terminals of the MOSFET that performs rectification.

14. The rectifier according to claim 12,
wherein the trigger voltage is a voltage of the capacitor.

15. The rectifier according to claim 14,
wherein the gate voltage of the MOSFET is reduced when the capacitor voltage is equal to or lower than a second voltage which is lower than the first voltage.

16. The rectifier according to claim 11,
wherein
the control circuit has a Zener diode, and
it is detected that the trigger voltage is equal to or higher than the first voltage by the Zener diode.

17. An alternator provided with a rectification circuit, comprising the rectifier according to claim 1 as a first rectifier, the first rectifier being provided in any one of LOW and HIGH sides of the rectification circuit.

18. The alternator according to claim 17,
further comprising a second rectifier provided in the other one of the LOW and HIGH sides opposite to that of the first rectifier,
the second rectifier having
a MOSFET configured to perform rectification,
a control circuit configured to receive a voltage between a pair of main terminals of the MOSFET and perform an on/off operation of the MOSFET on the basis of the voltage between the pair of main terminals, and
a capacitor configured to supply a source voltage to the control circuit; and
a hold circuit configured to electrically connect a path for flowing a current to the capacitor and a drain of the MOSFET and holds the connected state for a period independent from a voltage between the pair of main terminals when an internal trigger voltage of the control circuit is equal to or higher than a third voltage.

19. The alternator according to claim 18,
wherein the third voltage is higher than the first voltage.

20. The alternator according to claim 17,
further comprising a capacitor between a positive electrode side output terminal and a negative electrode side output terminal.

* * * * *